US012293965B2

(12) United States Patent
Mitchell, Jr.

(10) Patent No.: US 12,293,965 B2
(45) Date of Patent: *May 6, 2025

(54) OMNIDIRECTIONAL FLEXIBLE LIGHT EMITTING DEVICE

(71) Applicant: FEIT ELECTRIC COMPANY, INC., Pico Rivera, CA (US)

(72) Inventor: John D. Mitchell, Jr., Andover, MA (US)

(73) Assignee: FEIT ELECTRIC COMPANY, INC., Pico Rivera, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/529,938

(22) Filed: Dec. 5, 2023

(65) Prior Publication Data

US 2024/0347440 A1    Oct. 17, 2024

Related U.S. Application Data

(63) Continuation of application No. 16/983,747, filed on Aug. 3, 2020, now Pat. No. 11,876,042.

(51) Int. Cl.
*H01L 23/498* (2006.01)
*H01L 25/13* (2006.01)

(52) U.S. Cl.
CPC .... *H01L 23/4985* (2013.01); *H01L 23/49838* (2013.01); *H01L 25/13* (2013.01)

(58) Field of Classification Search
None
See application file for complete search history.

(56) References Cited

U.S. PATENT DOCUMENTS

| | | |
|---|---|---|
| 3,607,463 A | 9/1971 | Kinoshita et al. |
| 3,871,067 A | 3/1975 | Bogardus et al. |
| 3,938,177 A | 2/1976 | Hansen et al. |
| 3,999,280 A | 12/1976 | Hansen et al. |
| 4,026,692 A | 5/1977 | Bartholomew |
| 4,211,955 A | 7/1980 | Ray |
| 4,497,974 A | 2/1985 | Deckman et al. |

(Continued)

FOREIGN PATENT DOCUMENTS

| | | |
|---|---|---|
| AU | 07543/53 B2 | 11/2002 |
| AU | 07560/72 B2 | 1/2003 |

(Continued)

OTHER PUBLICATIONS

Narukawa, Y et al., "Ultra-High Efficiency White Light Emitting Diodes", Jpn. J. Appl. Phys., Oct. 13, 2006, pp. L1084-L1086, vol. 45, No. 41, The Japan Society of Applied Physics, Japan.

(Continued)

*Primary Examiner* — Nishath Yasmeen
(74) *Attorney, Agent, or Firm* — Alston & Bird LLP

(57) ABSTRACT

An omnidirectional light emitting device is provided. An example device includes a flexible substrate having a substrate length, a first substrate surface, and a second substrate surface. The flexible substrate is configured to be flexibly wrenched about a longitudinal axis that is parallel to the substrate length. The example device further includes a plurality of LED packages disposed on the first substrate surface. Each LED package of the plurality of LED packages is configured to emit light outward from the flexible substrate.

20 Claims, 9 Drawing Sheets

(56) References Cited

U.S. PATENT DOCUMENTS

| | | |
|---|---|---|
| 4,727,289 A | 2/1988 | Uchida |
| 5,376,580 A | 12/1994 | Kish et al. |
| 5,416,870 A | 5/1995 | Chun et al. |
| 5,696,389 A | 12/1997 | Ishikawa et al. |
| 5,708,280 A | 1/1998 | Lebby et al. |
| 5,726,535 A | 3/1998 | Yan |
| 5,775,792 A | 7/1998 | Wiese |
| 5,779,924 A | 7/1998 | Krames et al. |
| 5,780,867 A | 7/1998 | Fritz et al. |
| 5,814,870 A | 9/1998 | Spaeth |
| 5,886,401 A | 3/1999 | Liu |
| 5,905,275 A | 5/1999 | Nunoue et al. |
| 5,924,784 A | 7/1999 | Chliwnyj et al. |
| 5,925,898 A | 7/1999 | Werner |
| 5,932,048 A | 8/1999 | Furukawa et al. |
| 5,952,681 A | 9/1999 | Chen |
| 5,959,316 A | 9/1999 | Lowery |
| 5,998,232 A | 12/1999 | Maruska |
| 5,998,925 A | 12/1999 | Shimizu et al. |
| 6,015,719 A | 1/2000 | Kish et al. |
| 6,042,248 A | 3/2000 | Hannah et al. |
| 6,066,861 A | 5/2000 | Hoehn et al. |
| 6,091,085 A | 7/2000 | Lester |
| 6,133,589 A | 10/2000 | Krames et al. |
| 6,155,699 A | 12/2000 | Miller et al. |
| 6,218,807 B1 | 4/2001 | Sakaue et al. |
| 6,222,207 B1 | 4/2001 | Carter-Coman et al. |
| 6,229,160 B1 | 5/2001 | Krames et al. |
| 6,252,254 B1 | 6/2001 | Soules et al. |
| 6,262,534 B1 | 7/2001 | Johnson et al. |
| 6,310,364 B1 | 10/2001 | Uemura |
| 6,331,063 B1 | 12/2001 | Kamada et al. |
| 6,335,548 B1 | 1/2002 | Roberts et al. |
| 6,357,889 B1 | 3/2002 | Duggal et al. |
| 6,369,506 B1 | 4/2002 | Hata |
| 6,373,188 B1 | 4/2002 | Johnson et al. |
| 6,376,851 B1 | 4/2002 | Worley |
| 6,396,082 B1 | 5/2002 | Fukasawa et al. |
| 6,417,019 B1 | 7/2002 | Mueller et al. |
| 6,452,217 B1 | 9/2002 | Wojnarowski et al. |
| 6,482,664 B1 | 11/2002 | Lee et al. |
| 6,483,196 B1 | 11/2002 | Wojnarowski et al. |
| 6,492,725 B1 | 12/2002 | Loh et al. |
| 6,495,862 B1 | 12/2002 | Okazaki et al. |
| 6,504,301 B1 | 1/2003 | Lowery |
| 6,509,584 B2 | 1/2003 | Suzuki |
| 6,515,308 B1 | 2/2003 | Kneissl et al. |
| 6,523,978 B1 | 2/2003 | Huang |
| 6,525,464 B1 | 2/2003 | Chin |
| 6,547,423 B2 | 4/2003 | Marshall et al. |
| 6,548,956 B2 | 4/2003 | Forrest et al. |
| 6,550,953 B1 | 4/2003 | Ichikawa et al. |
| 6,568,834 B1 | 5/2003 | Scianna |
| 6,569,544 B1 | 5/2003 | Alain et al. |
| 6,573,530 B1 | 6/2003 | Sargent et al. |
| 6,573,537 B1 | 6/2003 | Steigerwald et al. |
| 6,583,550 B2 | 6/2003 | Iwasa et al. |
| 6,586,882 B1 | 7/2003 | Harbers |
| 6,603,151 B2 | 8/2003 | Lin et al. |
| 6,603,258 B1 | 8/2003 | Mueller-Mach et al. |
| 6,607,286 B2 | 8/2003 | West et al. |
| 6,607,931 B2 | 8/2003 | Streubel |
| 6,608,333 B1 | 8/2003 | Lee et al. |
| 6,608,439 B1 | 8/2003 | Sokolik et al. |
| 6,614,058 B2 | 9/2003 | Lin et al. |
| 6,635,902 B1 | 10/2003 | Lin |
| 6,639,360 B2 | 10/2003 | Roberts et al. |
| 6,642,618 B2 | 11/2003 | Yagi et al. |
| 6,649,939 B1 | 11/2003 | Wirth |
| 6,657,236 B1 | 12/2003 | Thibeault et al. |
| 6,657,767 B2 | 12/2003 | Bonardi et al. |
| 6,661,167 B2 | 12/2003 | Eliashevich et al. |
| 6,661,578 B2 | 12/2003 | Hedrick |
| 6,664,571 B1 | 12/2003 | Amann |
| 6,674,096 B2 | 1/2004 | Sommers |
| 6,677,610 B2 | 1/2004 | Choi et al. |
| 6,682,950 B2 | 1/2004 | Yang et al. |
| 6,686,218 B2 | 2/2004 | Lin et al. |
| 6,686,676 B2 | 2/2004 | McNulty et al. |
| 6,717,362 B1 | 4/2004 | Lee et al. |
| 6,719,936 B2 | 4/2004 | Carlton et al. |
| 6,729,746 B2 | 5/2004 | Suehiro et al. |
| 6,730,939 B2 | 5/2004 | Eisert et al. |
| 6,737,532 B2 | 5/2004 | Chen et al. |
| 6,737,681 B2 | 5/2004 | Koda |
| 6,746,295 B2 | 6/2004 | Sorg |
| 6,759,804 B2 | 7/2004 | Ellens et al. |
| 6,762,436 B1 | 7/2004 | Huang et al. |
| 6,765,236 B2 | 7/2004 | Sakurai |
| 6,777,871 B2 | 8/2004 | Duggal et al. |
| 6,784,460 B2 | 8/2004 | Ng et al. |
| 6,791,116 B2 | 9/2004 | Takahashi et al. |
| 6,791,119 B2 | 9/2004 | Slater et al. |
| 6,791,259 B1 | 9/2004 | Stokes et al. |
| 6,794,685 B2 | 9/2004 | Hata et al. |
| 6,803,607 B1 | 10/2004 | Chan et al. |
| 6,809,345 B2 | 10/2004 | Watanabe |
| 6,812,500 B2 | 11/2004 | Reeh et al. |
| 6,841,934 B2 | 1/2005 | Wang et al. |
| 6,844,572 B2 | 1/2005 | Sawaki et al. |
| 6,847,057 B1 | 1/2005 | Gardner et al. |
| 6,853,151 B2 | 2/2005 | Leong et al. |
| 6,874,910 B2 | 4/2005 | Sugimoto et al. |
| 6,893,890 B2 | 5/2005 | Takekuma et al. |
| 6,902,830 B2 | 6/2005 | Thompson et al. |
| 6,909,108 B2 | 6/2005 | Tang et al. |
| 6,914,267 B2 | 7/2005 | Fukasawa et al. |
| 6,914,268 B2 | 7/2005 | Shei et al. |
| 6,917,057 B2 | 7/2005 | Stokes et al. |
| 6,921,927 B2 | 7/2005 | Ng et al. |
| 6,922,424 B2 | 7/2005 | Weigert et al. |
| 6,932,495 B2 | 8/2005 | Sloan et al. |
| 6,936,761 B2 | 8/2005 | Pichler |
| 6,961,190 B1 | 11/2005 | Tamaoki et al. |
| 6,964,877 B2 | 11/2005 | Chen et al. |
| 6,969,874 B1 | 11/2005 | Gee et al. |
| 6,969,946 B2 | 11/2005 | Keuper |
| 6,972,208 B2 | 12/2005 | Hsieh et al. |
| 6,972,212 B2 | 12/2005 | Eisert et al. |
| 6,972,438 B2 | 12/2005 | Li et al. |
| 6,982,522 B2 | 1/2006 | Omoto |
| 6,987,613 B2 | 1/2006 | Pocius et al. |
| 6,995,402 B2 | 2/2006 | Ludowise et al. |
| 6,997,580 B2 | 2/2006 | Wong |
| 6,998,281 B2 | 2/2006 | Taskar et al. |
| 7,008,858 B2 | 3/2006 | Liu et al. |
| 7,009,213 B2 | 3/2006 | Camras et al. |
| 7,009,217 B2 | 3/2006 | Liu et al. |
| 7,015,514 B2 | 3/2006 | Baur et al. |
| 7,018,859 B2 | 3/2006 | Liao et al. |
| 7,019,456 B2 | 3/2006 | Yasukawa et al. |
| 7,026,261 B2 | 4/2006 | Hirose et al. |
| 7,026,657 B2 | 4/2006 | Bogner et al. |
| 7,030,552 B2 | 4/2006 | Chao et al. |
| 7,053,419 B1 | 5/2006 | Camras et al. |
| 7,070,304 B2 | 7/2006 | Imai |
| 7,071,034 B2 | 7/2006 | Ueda et al. |
| 7,072,096 B2 | 7/2006 | Holman et al. |
| 7,084,435 B2 | 8/2006 | Sugimoto et al. |
| 7,086,756 B2 | 8/2006 | Maxik |
| 7,091,653 B2 | 8/2006 | Ouderkirk et al. |
| 7,091,661 B2 | 8/2006 | Ouderkirk et al. |
| 7,098,589 B2 | 8/2006 | Erchak et al. |
| 7,102,213 B2 | 9/2006 | Sorg |
| 7,105,860 B2 | 9/2006 | Shei et al. |
| 7,119,271 B2 | 10/2006 | King et al. |
| 7,126,159 B2 | 10/2006 | Itai et al. |
| 7,129,635 B2 | 10/2006 | Tsujimura |
| 7,135,709 B1 | 11/2006 | Wirth et al. |
| 7,157,745 B2 | 1/2007 | Blonder et al. |
| 7,161,189 B2 | 1/2007 | Wu |
| 7,166,873 B2 | 1/2007 | Okazaki |
| 7,188,981 B2 | 3/2007 | Rodriguez et al. |
| 7,195,991 B2 | 3/2007 | Karnutsch et al. |

(56) References Cited

U.S. PATENT DOCUMENTS

| | | |
|---|---|---|
| 7,202,506 B1 | 4/2007 | Denbaars et al. |
| 7,210,806 B2 | 5/2007 | Holman et al. |
| 7,210,818 B2 | 5/2007 | Luk et al. |
| 7,217,004 B2 | 5/2007 | Park et al. |
| 7,223,620 B2 | 5/2007 | Jaeger et al. |
| 7,223,998 B2 | 5/2007 | Schwach et al. |
| 7,226,189 B2 | 6/2007 | Lee et al. |
| 7,227,304 B2 | 6/2007 | Tsujimura et al. |
| 7,235,817 B2 | 6/2007 | Yano et al. |
| 7,244,630 B2 | 7/2007 | Krames et al. |
| 7,250,728 B2 | 7/2007 | Chen et al. |
| 7,253,447 B2 | 8/2007 | Oishi et al. |
| 7,253,448 B2 | 8/2007 | Roberts et al. |
| 7,262,440 B2 | 8/2007 | Choi et al. |
| 7,264,378 B2 | 9/2007 | Loh |
| 7,268,371 B2 | 9/2007 | Krames et al. |
| 7,273,291 B2 | 9/2007 | Kim et al. |
| 7,281,818 B2 | 10/2007 | You et al. |
| 7,281,860 B2 | 10/2007 | Fujita |
| 7,282,853 B2 | 10/2007 | Yano et al. |
| 7,286,296 B2 | 10/2007 | Chaves et al. |
| 7,288,420 B1 | 10/2007 | Yamazaki et al. |
| 7,291,864 B2 | 11/2007 | Weisbuch et al. |
| 7,300,217 B2 | 11/2007 | Mizoguchi |
| 7,309,882 B2 | 12/2007 | Chen |
| 7,312,573 B2 | 12/2007 | Chang et al. |
| 7,317,210 B2 | 1/2008 | Brabec et al. |
| 7,319,246 B2 | 1/2008 | Soules et al. |
| 7,323,704 B2 | 1/2008 | Itai |
| 7,329,982 B2 | 2/2008 | Conner et al. |
| 7,331,697 B1 | 2/2008 | Hulse |
| 7,332,747 B2 | 2/2008 | Uemura et al. |
| 7,341,878 B2 | 3/2008 | Krames et al. |
| 7,344,902 B2 | 3/2008 | Basin et al. |
| 7,344,958 B2 | 3/2008 | Murai et al. |
| 7,345,298 B2 | 3/2008 | Weisbuch et al. |
| 7,350,936 B2 | 4/2008 | Ducharme et al. |
| 7,352,006 B2 | 4/2008 | Beeson et al. |
| 7,354,174 B1 | 4/2008 | Yan |
| 7,358,537 B2 | 4/2008 | Yeh et al. |
| 7,358,539 B2 | 4/2008 | Venugopalan et al. |
| 7,358,599 B2 | 4/2008 | Ohe et al. |
| 7,361,938 B2 | 4/2008 | Mueller et al. |
| 7,374,958 B2 | 5/2008 | Pan et al. |
| 7,380,962 B2 | 6/2008 | Chaves et al. |
| 7,390,117 B2 | 6/2008 | Leatherdale et al. |
| 7,391,153 B2 | 6/2008 | Suehiro et al. |
| 7,396,142 B2 | 7/2008 | Laizure et al. |
| 7,397,177 B2 | 7/2008 | Takahashi et al. |
| 7,400,439 B2 | 7/2008 | Holman |
| 7,408,204 B1 | 8/2008 | Tung |
| 7,414,270 B2 | 8/2008 | Kim et al. |
| 7,427,145 B2 | 9/2008 | Jang et al. |
| 7,431,477 B2 | 10/2008 | Chou et al. |
| 7,435,997 B2 | 10/2008 | Arndt et al. |
| 7,449,789 B2 | 11/2008 | Chen |
| 7,456,483 B2 | 11/2008 | Tsukamoto et al. |
| 7,463,419 B2 | 12/2008 | Weber |
| 7,465,962 B2 | 12/2008 | Kametani et al. |
| 7,479,662 B2 | 1/2009 | Soules et al. |
| 7,479,664 B2 | 1/2009 | Williams |
| 7,482,638 B2 | 1/2009 | Wall, Jr. |
| 7,489,068 B2 | 2/2009 | Hsieh et al. |
| 7,489,075 B2 | 2/2009 | Lee |
| 7,498,734 B2 | 3/2009 | Suehiro et al. |
| 7,504,671 B2 | 3/2009 | Ishidu et al. |
| 7,507,001 B2 | 3/2009 | Kit |
| 7,510,289 B2 | 3/2009 | Takekuma |
| 7,514,723 B2 | 4/2009 | Arndt et al. |
| 7,518,149 B2 | 4/2009 | Maaskant et al. |
| 7,521,782 B2 | 4/2009 | Ishii |
| 7,531,835 B2 | 5/2009 | Heeger et al. |
| 7,534,002 B2 | 5/2009 | Yamaguchi et al. |
| 7,534,634 B2 | 5/2009 | Jaeger et al. |
| 7,545,042 B2 | 6/2009 | Yang |
| 7,582,910 B2 | 9/2009 | David et al. |
| 7,585,083 B2 | 9/2009 | Kim et al. |
| 7,586,127 B2 | 9/2009 | Nomura et al. |
| 7,602,118 B2 | 10/2009 | Cok et al. |
| 7,626,255 B2 | 12/2009 | Weekamp et al. |
| 7,646,146 B2 | 1/2010 | Cok |
| 7,666,715 B2 | 2/2010 | Brunner et al. |
| 7,687,813 B2 | 3/2010 | Nakamura et al. |
| 7,692,205 B2 | 4/2010 | Wang et al. |
| 7,693,360 B2 | 4/2010 | Shimizu et al. |
| 7,704,763 B2 | 4/2010 | Fujii et al. |
| 7,710,016 B2 | 5/2010 | Miki et al. |
| 7,717,589 B2 | 5/2010 | Nishioka et al. |
| 7,719,020 B2 | 5/2010 | Murai et al. |
| 7,719,182 B2 | 5/2010 | Cok et al. |
| 7,723,740 B2 | 5/2010 | Takashima et al. |
| 7,733,011 B2 | 6/2010 | Cina et al. |
| 7,742,677 B2 | 6/2010 | Eberhard et al. |
| 7,745,986 B2 | 6/2010 | Ito et al. |
| 7,748,879 B2 | 7/2010 | Koike et al. |
| 7,755,096 B2 | 7/2010 | Weisbuch et al. |
| 7,759,140 B2 | 7/2010 | Lee et al. |
| 7,766,508 B2 | 8/2010 | Mllard et al. |
| 7,772,597 B2 | 8/2010 | Inoue |
| 7,781,787 B2 | 8/2010 | Suehiro et al. |
| 7,781,789 B2 | 8/2010 | Denbaars et al. |
| 7,824,937 B2 | 11/2010 | Suehiro et al. |
| 7,842,526 B2 | 11/2010 | Hadame et al. |
| 7,847,302 B2 | 12/2010 | Basin et al. |
| 7,851,815 B2 | 12/2010 | Diamantidis |
| 7,860,356 B2 | 12/2010 | Van et al. |
| 7,868,341 B2 | 1/2011 | Diana et al. |
| 7,872,275 B2 | 1/2011 | Diamantidis |
| 7,872,414 B2 | 1/2011 | Sugita et al. |
| 7,875,897 B2 | 1/2011 | Suehiro |
| 7,932,111 B2 | 4/2011 | Edmond |
| 7,950,831 B2 | 5/2011 | Moon |
| 7,956,371 B2 | 6/2011 | Denbaars et al. |
| 7,964,883 B2 | 6/2011 | Mazzochette et al. |
| RE42,636 E | 8/2011 | Chen et al. |
| 7,994,527 B2 | 8/2011 | Denbaars et al. |
| 7,998,773 B2 | 8/2011 | Abramov et al. |
| 8,022,423 B2 | 9/2011 | Nakamura et al. |
| 8,035,117 B2 | 10/2011 | Denbaars et al. |
| 8,039,849 B2 | 10/2011 | Lam |
| 8,071,997 B2 | 12/2011 | Scotch et al. |
| 8,109,635 B2 | 2/2012 | Allon et al. |
| 8,158,987 B2 | 4/2012 | Nabekura et al. |
| 8,162,493 B2 | 4/2012 | Skiver et al. |
| 8,212,262 B2 | 7/2012 | Emerson et al. |
| 8,258,519 B2 | 9/2012 | Hsu |
| 8,294,166 B2 | 10/2012 | Nakamura et al. |
| 8,366,295 B2 | 2/2013 | Tanda et al. |
| 8,368,109 B2 | 2/2013 | Iso et al. |
| 8,378,368 B2 | 2/2013 | Hsu et al. |
| 8,395,167 B2 | 3/2013 | Kang et al. |
| 8,405,307 B2 | 3/2013 | Yano et al. |
| 8,455,909 B2 | 6/2013 | Negley |
| 8,541,788 B2 | 9/2013 | Denbaars et al. |
| 8,558,446 B2 | 10/2013 | Miki et al. |
| 8,610,145 B2 | 12/2013 | Yano |
| 8,637,892 B2 | 1/2014 | Egoshi et al. |
| 8,710,535 B2 | 4/2014 | Jo et al. |
| 8,835,959 B2 | 9/2014 | Nakamura et al. |
| 8,860,051 B2 | 10/2014 | Fellows et al. |
| 8,882,290 B2 | 11/2014 | Hsieh et al. |
| 8,889,440 B2 | 11/2014 | Chen et al. |
| 9,276,156 B2 | 3/2016 | King et al. |
| 9,666,772 B2 | 5/2017 | Ibbetson et al. |
| 9,705,059 B2 | 7/2017 | Park |
| 9,752,734 B2 | 9/2017 | Tanda et al. |
| D818,153 S | 5/2018 | Feit |
| 10,103,306 B2 | 10/2018 | Kim |
| 10,217,916 B2 | 2/2019 | Nakamura et al. |
| 10,312,422 B2 | 6/2019 | Camras et al. |
| 10,374,003 B2 | 8/2019 | Choi et al. |
| 10,724,690 B2 | 7/2020 | Feit |
| 2001/0000209 A1 | 4/2001 | Krames et al. |
| 2001/0002049 A1 | 5/2001 | Reeh et al. |

(56) References Cited

U.S. PATENT DOCUMENTS

| | | |
|---|---|---|
| 2001/0010598 A1 | 8/2001 | Aritake et al. |
| 2001/0033135 A1 | 10/2001 | Duggal et al. |
| 2002/0006040 A1 | 1/2002 | Kamada et al. |
| 2002/0008452 A1 | 1/2002 | Coushaine et al. |
| 2002/0066905 A1 | 6/2002 | Wang et al. |
| 2002/0085601 A1 | 7/2002 | Wang et al. |
| 2002/0123204 A1 | 9/2002 | Torvik |
| 2002/0131726 A1 | 9/2002 | Lin et al. |
| 2002/0141006 A1 | 10/2002 | Pocius et al. |
| 2002/0158578 A1 | 10/2002 | Eliashevich et al. |
| 2002/0171087 A1 | 11/2002 | Krames et al. |
| 2003/0010975 A1 | 1/2003 | Gibb et al. |
| 2003/0015959 A1 | 1/2003 | Tomoda et al. |
| 2003/0031015 A1 | 2/2003 | Ishibashi |
| 2003/0039119 A1 | 2/2003 | Cao |
| 2003/0057444 A1 | 3/2003 | Niki et al. |
| 2003/0057832 A1 | 3/2003 | Juestel et al. |
| 2003/0075723 A1 | 4/2003 | Heremans et al. |
| 2003/0100140 A1 | 5/2003 | Lin et al. |
| 2003/0124754 A1 | 7/2003 | Farahi et al. |
| 2003/0141506 A1 | 7/2003 | Sano et al. |
| 2003/0151361 A1 | 8/2003 | Ishizaka |
| 2003/0193803 A1 | 10/2003 | Lin |
| 2003/0213969 A1 | 11/2003 | Wang et al. |
| 2003/0215766 A1 | 11/2003 | Fischer et al. |
| 2004/0000727 A1 | 1/2004 | Hsu |
| 2004/0007709 A1 | 1/2004 | Kondo |
| 2004/0007980 A1 | 1/2004 | Shibata |
| 2004/0007981 A1 | 1/2004 | Shibata |
| 2004/0008525 A1 | 1/2004 | Shibata |
| 2004/0036074 A1 | 2/2004 | Kondo |
| 2004/0037079 A1* | 2/2004 | Luk .................. F21S 4/26 362/249.14 |
| 2004/0037080 A1 | 2/2004 | Luk et al. |
| 2004/0041161 A1 | 3/2004 | Kim |
| 2004/0046179 A1 | 3/2004 | Baur et al. |
| 2004/0051111 A1 | 3/2004 | Ota et al. |
| 2004/0070014 A1 | 4/2004 | Lin et al. |
| 2004/0075382 A1 | 4/2004 | Stegamat et al. |
| 2004/0079408 A1 | 4/2004 | Fetzer et al. |
| 2004/0089868 A1 | 5/2004 | Hon et al. |
| 2004/0094772 A1 | 5/2004 | Hon et al. |
| 2004/0095502 A1 | 5/2004 | Losehand et al. |
| 2004/0109327 A1 | 6/2004 | Coushaine et al. |
| 2004/0155565 A1 | 8/2004 | Holder et al. |
| 2004/0164311 A1 | 8/2004 | Uemura |
| 2004/0173807 A1 | 9/2004 | Tian et al. |
| 2004/0173810 A1 | 9/2004 | Lin et al. |
| 2004/0184495 A1 | 9/2004 | Kondo |
| 2004/0188700 A1 | 9/2004 | Fukasawa et al. |
| 2004/0188791 A1 | 9/2004 | Horng et al. |
| 2004/0211970 A1 | 10/2004 | Hayashimoto et al. |
| 2004/0212300 A1 | 10/2004 | Chao et al. |
| 2004/0239242 A1 | 12/2004 | Mano et al. |
| 2004/0239611 A1 | 12/2004 | Huang et al. |
| 2004/0245531 A1 | 12/2004 | Fuii et al. |
| 2004/0257797 A1 | 12/2004 | Suehiro et al. |
| 2004/0263064 A1 | 12/2004 | Huang |
| 2005/0007010 A1 | 1/2005 | Lee |
| 2005/0029528 A1 | 2/2005 | Ishikawa |
| 2005/0030761 A1 | 2/2005 | Burgess |
| 2005/0032257 A1 | 2/2005 | Camras et al. |
| 2005/0035354 A1 | 2/2005 | Lin et al. |
| 2005/0040410 A1 | 2/2005 | Ledentsov et al. |
| 2005/0062830 A1 | 3/2005 | Taki et al. |
| 2005/0077532 A1 | 4/2005 | Ota et al. |
| 2005/0082546 A1 | 4/2005 | Lee et al. |
| 2005/0082562 A1 | 4/2005 | Ou et al. |
| 2005/0093008 A1 | 5/2005 | Suehiro et al. |
| 2005/0111240 A1 | 5/2005 | Yonekubo |
| 2005/0121688 A1 | 6/2005 | Nagai et al. |
| 2005/0133810 A1 | 6/2005 | Roberts et al. |
| 2005/0140291 A1 | 6/2005 | Hirakata et al. |
| 2005/0145865 A1 | 7/2005 | Okuyama et al. |
| 2005/0156510 A1 | 7/2005 | Chua et al. |
| 2005/0161694 A1 | 7/2005 | Reeh et al. |
| 2005/0168987 A1 | 8/2005 | Tamaoki et al. |
| 2005/0184300 A1 | 8/2005 | Tazima et al. |
| 2005/0189551 A1 | 9/2005 | Peng et al. |
| 2005/0194598 A1 | 9/2005 | Kim et al. |
| 2005/0196887 A1 | 9/2005 | Liu |
| 2005/0205884 A1 | 9/2005 | Kim et al. |
| 2005/0207152 A1 | 9/2005 | Maxik |
| 2005/0211997 A1 | 9/2005 | Suehiro et al. |
| 2005/0212002 A1 | 9/2005 | Sanga et al. |
| 2005/0218790 A1 | 10/2005 | Blumel |
| 2005/0224830 A1 | 10/2005 | Blonder et al. |
| 2005/0237005 A1 | 10/2005 | Maxik |
| 2005/0242734 A1 | 11/2005 | Maxik |
| 2005/0243570 A1 | 11/2005 | Chaves et al. |
| 2005/0248271 A1 | 11/2005 | Ng et al. |
| 2005/0253157 A1 | 11/2005 | Ohashi et al. |
| 2005/0253158 A1 | 11/2005 | Yasukawa et al. |
| 2005/0265404 A1 | 12/2005 | Ashdown |
| 2006/0000964 A1 | 1/2006 | Ye et al. |
| 2006/0001036 A1 | 1/2006 | Jacob et al. |
| 2006/0001186 A1 | 1/2006 | Richardson et al. |
| 2006/0003089 A1 | 1/2006 | Kathirgamanathan |
| 2006/0006408 A1 | 1/2006 | Suehiro et al. |
| 2006/0008941 A1 | 1/2006 | Haskell et al. |
| 2006/0009006 A1 | 1/2006 | Murai et al. |
| 2006/0012299 A1 | 1/2006 | Suehiro et al. |
| 2006/0017055 A1 | 1/2006 | Cropper et al. |
| 2006/0038187 A1 | 2/2006 | Ueno |
| 2006/0043399 A1 | 3/2006 | Miyagaki et al. |
| 2006/0054905 A1 | 3/2006 | Schwach et al. |
| 2006/0063028 A1 | 3/2006 | Leurs |
| 2006/0082295 A1 | 4/2006 | Chin et al. |
| 2006/0091376 A1 | 5/2006 | Kim et al. |
| 2006/0097631 A1 | 5/2006 | Lee |
| 2006/0118805 A1 | 6/2006 | Camras et al. |
| 2006/0125385 A1 | 6/2006 | Lu et al. |
| 2006/0138439 A1 | 6/2006 | Bogner et al. |
| 2006/0145170 A1 | 7/2006 | Cho |
| 2006/0154392 A1 | 7/2006 | Tran et al. |
| 2006/0163586 A1 | 7/2006 | Denbaars et al. |
| 2006/0163601 A1 | 7/2006 | Harle et al. |
| 2006/0164836 A1 | 7/2006 | Suehiro et al. |
| 2006/0171152 A1 | 8/2006 | Suehiro et al. |
| 2006/0175624 A1 | 8/2006 | Sharma et al. |
| 2006/0175625 A1 | 8/2006 | Yokotani et al. |
| 2006/0186418 A1 | 8/2006 | Edmond et al. |
| 2006/0186424 A1 | 8/2006 | Fujimoto et al. |
| 2006/0189026 A1 | 8/2006 | Cropper et al. |
| 2006/0192217 A1 | 8/2006 | David et al. |
| 2006/0193130 A1 | 8/2006 | Ishibashi |
| 2006/0194359 A1 | 8/2006 | Weisbuch et al. |
| 2006/0194363 A1 | 8/2006 | Giesberg et al. |
| 2006/0202219 A1 | 9/2006 | Ohashi et al. |
| 2006/0202226 A1 | 9/2006 | Weisbuch et al. |
| 2006/0234486 A1 | 10/2006 | Speck et al. |
| 2006/0237723 A1 | 10/2006 | Ito |
| 2006/0237732 A1 | 10/2006 | Nagai et al. |
| 2006/0238136 A1 | 10/2006 | Johnson et al. |
| 2006/0239006 A1 | 10/2006 | Chaves et al. |
| 2006/0243993 A1 | 11/2006 | Yu |
| 2006/0246722 A1 | 11/2006 | Speck et al. |
| 2006/0261364 A1 | 11/2006 | Suehiro et al. |
| 2006/0267026 A1 | 11/2006 | Kim et al. |
| 2006/0273336 A1 | 12/2006 | Fujikura et al. |
| 2006/0273343 A1 | 12/2006 | Nakahata et al. |
| 2006/0284195 A1 | 12/2006 | Nagai |
| 2006/0289892 A1 | 12/2006 | Lee et al. |
| 2006/0292747 A1 | 12/2006 | Loh |
| 2007/0001185 A1 | 1/2007 | Lu et al. |
| 2007/0001186 A1 | 1/2007 | Murai et al. |
| 2007/0012940 A1 | 1/2007 | Suh et al. |
| 2007/0019409 A1 | 1/2007 | Nawashiro et al. |
| 2007/0029560 A1 | 2/2007 | Su |
| 2007/0065960 A1 | 3/2007 | Fukshima et al. |
| 2007/0085075 A1 | 4/2007 | Yamazaki et al. |
| 2007/0085100 A1 | 4/2007 | Diana et al. |
| 2007/0102721 A1 | 5/2007 | Denbaars et al. |
| 2007/0120135 A1 | 5/2007 | Soules et al. |

(56) References Cited

U.S. PATENT DOCUMENTS

| | | |
|---|---|---|
| 2007/0125995 A1 | 6/2007 | Weisbuch et al. |
| 2007/0139949 A1 | 6/2007 | Tanda et al. |
| 2007/0145397 A1 | 6/2007 | Denbaars et al. |
| 2007/0147072 A1 | 6/2007 | Scobbo et al. |
| 2007/0182297 A1 | 8/2007 | Drazic et al. |
| 2007/0189013 A1 | 8/2007 | Ford |
| 2007/0200128 A1 | 8/2007 | Yano |
| 2007/0252164 A1 | 11/2007 | Zhong et al. |
| 2007/0267976 A1 | 11/2007 | Bohler et al. |
| 2007/0290224 A1 | 12/2007 | Ogawa |
| 2008/0017870 A1 | 1/2008 | Diamantidis |
| 2008/0030691 A1 | 2/2008 | Godo |
| 2008/0030993 A1 | 2/2008 | Narendran et al. |
| 2008/0111146 A1 | 5/2008 | Nakamura et al. |
| 2008/0121918 A1 | 5/2008 | Denbaars et al. |
| 2008/0128730 A1 | 6/2008 | Fellows et al. |
| 2008/0128731 A1 | 6/2008 | Denbaars et al. |
| 2008/0135864 A1 | 6/2008 | David et al. |
| 2008/0137360 A1 | 6/2008 | Van et al. |
| 2008/0149949 A1 | 6/2008 | Nakamura et al. |
| 2008/0149959 A1 | 6/2008 | Nakamura et al. |
| 2008/0169752 A1 | 7/2008 | Hattori et al. |
| 2008/0173890 A1 | 7/2008 | Sung |
| 2008/0182420 A1 | 7/2008 | Hu et al. |
| 2008/0191191 A1 | 8/2008 | Kim |
| 2008/0191224 A1 | 8/2008 | Emerson et al. |
| 2009/0078951 A1 | 3/2009 | Miki et al. |
| 2009/0114928 A1 | 5/2009 | Messere et al. |
| 2009/0121250 A1 | 5/2009 | Denbaars et al. |
| 2009/0140630 A1 | 6/2009 | Kijima et al. |
| 2009/0146170 A1 | 6/2009 | Zhong et al. |
| 2009/0315055 A1 | 12/2009 | Tamboli et al. |
| 2010/0059787 A1 | 3/2010 | Hoshina |
| 2010/0090240 A1 | 4/2010 | Tamboli et al. |
| 2010/0283078 A1 | 11/2010 | Denbaars et al. |
| 2010/0289043 A1 | 11/2010 | Aurelien et al. |
| 2011/0050073 A1* | 3/2011 | Huang ............... F21K 9/00 313/317 |
| 2011/0079806 A1 | 4/2011 | Hsu et al. |
| 2011/0089455 A1 | 4/2011 | Diana et al. |
| 2011/0101399 A1 | 5/2011 | Suehiro et al. |
| 2011/0108863 A1 | 5/2011 | Yamazaki et al. |
| 2011/0193061 A1 | 8/2011 | Hsu |
| 2011/0266555 A1 | 11/2011 | Abramov et al. |
| 2012/0043568 A1 | 2/2012 | Yan et al. |
| 2012/0146503 A1* | 6/2012 | Negley ............... F21K 9/62 313/46 |
| 2012/0161180 A1 | 6/2012 | Komatsu et al. |
| 2014/0022788 A1* | 1/2014 | Dan ................ F21V 3/02 362/249.02 |
| 2014/0147682 A1 | 5/2014 | Takano et al. |
| 2014/0252396 A1 | 9/2014 | Fujii et al. |
| 2014/0292618 A1 | 10/2014 | Yamazaki et al. |
| 2015/0102378 A1 | 4/2015 | Huang et al. |
| 2015/0270444 A1 | 9/2015 | Liu |
| 2016/0238201 A1* | 8/2016 | Ray ............... H05K 1/16 |
| 2016/0351619 A1* | 12/2016 | Cramer ............ H04M 1/185 |
| 2016/0377237 A1* | 12/2016 | Zhang ............ F21K 9/232 362/311.02 |
| 2017/0018049 A1* | 1/2017 | Ray ............... G06Q 90/00 |
| 2017/0263834 A1* | 9/2017 | Yamaguchi ......... H01L 33/56 |
| 2018/0158988 A1 | 6/2018 | Niki et al. |
| 2018/0190888 A1 | 7/2018 | Kim |
| 2019/0045593 A1* | 2/2019 | Miskin ............. H05B 45/39 |
| 2019/0293242 A1* | 9/2019 | Park ............... H01L 33/504 |
| 2020/0200337 A1* | 6/2020 | Hikmet ............ H05K 1/0274 |
| 2020/0209658 A1* | 7/2020 | Xiao ............ G02F 1/133603 |
| 2022/0037237 A1 | 2/2022 | Feit |

FOREIGN PATENT DOCUMENTS

| | | |
|---|---|---|
| AU | 2010257325 A1 | 1/2011 |
| CA | 3013021 A1 | 8/2019 |
| CN | 2831445 Y | 10/2006 |
| DE | 19807758 A1 | 12/1998 |
| DE | 10245932 B3 | 2/2004 |
| DE | 102004040518 A1 | 5/2005 |
| DE | 10361801 A1 | 8/2005 |
| DE | 102004028143 A1 | 1/2006 |
| DE | 112007000313 T5 | 7/2009 |
| DE | 102017105918 A1 * | 9/2018 |
| EP | 1081771 A2 | 3/2001 |
| EP | 1116419 A1 | 7/2001 |
| EP | 1207563 A2 | 5/2002 |
| EP | 1213773 A1 | 6/2002 |
| EP | 1225643 A1 | 7/2002 |
| EP | 1357331 A2 | 10/2003 |
| EP | 1416543 A1 | 5/2004 |
| EP | 1429395 A2 | 6/2004 |
| EP | 1536487 A1 | 6/2005 |
| EP | 1603170 A1 | 12/2005 |
| EP | 1843402 A1 | 10/2007 |
| EP | 1876385 A2 | 1/2008 |
| EP | 2711399 A1 | 3/2014 |
| EP | 3682158 A1 | 7/2020 |
| ES | 2338925 T3 | 5/2010 |
| FR | 2858859 A1 | 2/2005 |
| GB | 2345954 A | 7/2000 |
| GB | 2371679 A | 7/2002 |
| GB | 2413698 A | 11/2005 |
| JP | 01-186590 A | 7/1989 |
| JP | 02-010395 A | 1/1990 |
| JP | 05-324300 A | 12/1993 |
| JP | 08-298345 A | 11/1996 |
| JP | 09-006260 A | 1/1997 |
| JP | 09-027642 A | 1/1997 |
| JP | 09-055540 A | 2/1997 |
| JP | 10-032351 A | 2/1998 |
| JP | 10-200165 A | 7/1998 |
| JP | 11-017223 A | 1/1999 |
| JP | 11-046019 A | 2/1999 |
| JP | 2000-277808 A | 10/2000 |
| JP | 2001-024223 A | 1/2001 |
| JP | 2001-044516 A | 2/2001 |
| JP | 3075689 U | 2/2001 |
| JP | 2001-068731 A | 3/2001 |
| JP | 2001-111112 A | 4/2001 |
| JP | 2001-126515 A | 5/2001 |
| JP | 2001-160629 A | 6/2001 |
| JP | 2001-194232 A | 7/2001 |
| JP | 3219000 B2 | 10/2001 |
| JP | 2002-008735 A | 1/2002 |
| JP | 2002-084002 A | 3/2002 |
| JP | 2002-124589 A | 4/2002 |
| JP | 2002-185045 A | 6/2002 |
| JP | 2002-203991 A | 7/2002 |
| JP | 2002-208735 A | 7/2002 |
| JP | 2002-232020 A | 8/2002 |
| JP | 2002-280614 A | 9/2002 |
| JP | 2002-289925 A | 10/2002 |
| JP | 2002-314152 A | 10/2002 |
| JP | 2003-007103 A | 1/2003 |
| JP | 2003-011417 A | 1/2003 |
| JP | 2003-016808 A | 1/2003 |
| JP | 2003-069085 A | 3/2003 |
| JP | 2003-163090 A | 6/2003 |
| JP | 2003-249692 A | 9/2003 |
| JP | 2003-318441 A | 11/2003 |
| JP | 2003-347586 A | 12/2003 |
| JP | 2004-111981 A | 4/2004 |
| JP | 2004-158557 A | 6/2004 |
| JP | 2004-253743 A | 9/2004 |
| JP | 2004-296575 A | 10/2004 |
| JP | 2004-296999 A | 10/2004 |
| JP | 2004-311677 A | 11/2004 |
| JP | 2005-035864 A | 2/2005 |
| JP | 2005-057310 A | 3/2005 |
| JP | 2005-086051 A | 3/2005 |
| JP | 2005-093102 A | 4/2005 |
| JP | 2005-109289 A | 4/2005 |
| JP | 2005-150261 A | 6/2005 |
| JP | 2005-183900 A | 7/2005 |
| JP | 2005-191197 A | 7/2005 |

(56) References Cited

FOREIGN PATENT DOCUMENTS

| | | |
|---|---|---|
| JP | 2005-191514 A | 7/2005 |
| JP | 2005-267926 A | 9/2005 |
| JP | 2005-268323 A | 9/2005 |
| JP | 2005-326757 A | 11/2005 |
| JP | 2005-347677 A | 12/2005 |
| JP | 2005-353816 A | 12/2005 |
| JP | 2006-024615 A | 1/2006 |
| JP | 2006-032387 A | 2/2006 |
| JP | 2006-041479 A | 2/2006 |
| JP | 2006-060034 A | 3/2006 |
| JP | 2006-128227 A | 5/2006 |
| JP | 2006-156590 A | 6/2006 |
| JP | 2006-165326 A | 6/2006 |
| JP | 2006-179718 A | 7/2006 |
| JP | 2006-191103 A | 7/2006 |
| JP | 2006-210824 A | 8/2006 |
| JP | 2006-229259 A | 8/2006 |
| JP | 2006-237264 A | 9/2006 |
| JP | 2006-245066 A | 9/2006 |
| JP | 2006-253298 A | 9/2006 |
| JP | 2006-261688 A | 9/2006 |
| JP | 2006-278751 A | 10/2006 |
| JP | 2006-278924 A | 10/2006 |
| JP | 2006-287113 A | 10/2006 |
| JP | 2006-294907 A | 10/2006 |
| JP | 2006-303258 A | 11/2006 |
| JP | 2007-165811 A | 6/2007 |
| JP | 3970800 B2 | 9/2007 |
| JP | 2007-311626 A | 11/2007 |
| JP | 2007-324220 A | 12/2007 |
| JP | 2007-324326 A | 12/2007 |
| JP | 4076329 B2 | 4/2008 |
| KR | 10-2002-0097420 A | 12/2002 |
| KR | 20-0403690 Y1 | 12/2005 |
| KR | 10-0563372 B1 | 3/2006 |
| KR | 10-0618941 B1 | 9/2006 |
| KR | 10-0619441 B1 | 9/2006 |
| KR | 10-0626365 B1 | 9/2006 |
| KR | 10-0643582 B1 | 11/2006 |
| KR | 10-0715580 B1 | 5/2007 |
| KR | 10-0733903 B1 | 7/2007 |
| KR | 10-0786798 B1 | 12/2007 |
| KR | 10-0796670 B1 | 1/2008 |
| KR | 10-0808705 B1 | 2/2008 |
| KR | 10-0828174 B1 | 5/2008 |
| KR | 10-0840637 B1 | 6/2008 |
| KR | 2011-0000749 U | 1/2011 |
| KR | 10-1035316 B1 | 5/2011 |
| KR | 10-1147342 B1 | 5/2012 |
| KR | 10-1251683 B1 | 4/2013 |
| SG | 100618 A1 | 12/2003 |
| TW | 586096 B | 5/2004 |
| WO | 01/08453 A1 | 2/2001 |
| WO | 01/29909 A1 | 4/2001 |
| WO | 01/41512 A1 | 6/2001 |
| WO | 01/47037 A1 | 6/2001 |
| WO | 02/90825 A1 | 11/2002 |
| WO | 2005/064666 A1 | 7/2005 |
| WO | 2005/066946 A1 | 7/2005 |
| WO | 2005/083037 A1 | 9/2005 |
| WO | 2005/124879 A1 | 12/2005 |
| WO | 2006/009854 A2 | 1/2006 |
| WO | 2006/098545 A2 | 9/2006 |
| WO | 2006/105644 A1 | 10/2006 |
| WO | 2006/131087 A1 | 12/2006 |
| WO | 2007/055455 A1 | 5/2007 |
| WO | 2019/048345 A1 | 3/2019 |
| WO | 2020/002144 A1 | 1/2020 |
| WO | WO-2020088966 A1 * | 5/2020 ............. F21K 9/232 |

OTHER PUBLICATIONS

Noctron seeks Chinese partners to make innovative LED products (Aug. 31, 2006)—News—LEDs Magazine (available at least as early as Oct. 17, 2006 as contemporaneously archived by http://web.archive.org/web/20061017131530/http://ledsmagazine.com/articles/news/3/8/23/1) retrieved on Nov. 1, 2019, 2 pages.

Orita, Kenji, et al., "High-Extraction-Efficiency Blue Light-Emitting Diode Using Extended-Pitch Photonic Crystal", Jpn. J. Appl. Phys., Aug. 25, 2004, pp. 5809-5813, vol. 43, No. 8B, The Japan Society of Applied Physics, Japan.

Outgoing—ISA/210—International Search Report and Written Opinion Mailed on Oct. 20, 2021 for WO Application No. PCT/US21/043701, 11 page(s).

Oxford Dictionary of Science, Sixth Edition, 2010, p. 834, Oxford University Press, UK.

Pankove, Jacques I. and Theodore D. Moustakas (Eds.). (Oct. 1999) Gallium Nitride (GaN) II. In: R.K. Willardson and E.R. Weber (Series Eds.), Semiconductors and Semimetals, p. 339, vol. 57, Academic Press, US.

Parthasarathy, G., et al., "A Metal-Free Cathode for Organic Semiconductor Devices", Applied Physics Letters, Apr. 27, 1998, pp. 2138-2140, vol. 72, No. 17, American Institute of Physics, US.

Parthasarathy, Gautam, et al., "A Full-Color Transparent Metal-Free Stacked Organic Light Emitting Device with Simplified Pixel Biasing", Advanced Materials, Aug. 1999, vol. 11, No. 11, pp. 907-910, Wiley-VCH Verlag GmbH & Co. KGaA, Germany.

Peng, Wei Chih, et al. "Enhanced Light Output in Double Roughened GaN Light-Emitting Diodes via Various Texturing Treatments of Undoped-GaN Layer", Japanese Journal of Applied Physics, Oct. 6, 2006, pp. 7709-7712, vol. 45, No. 10A, The Japan Society of Applied Physics, Japan.

Peng, Wei Chih, et al., "Enhance the Luminance Intensity ofInGaN—GaN Light-Emitting Diode by Roughening both the p-GaN Surface and the Undoped-GaN Surface Using Wafer Bonding Methods", ECS Transactions, Jul. 26, 2006, vol. 3, No. 6, pp. 335-338, The Electrochemical Society, US.

Peng, Wei Chih, et al., "Improved Luminance Intensity ofInGaN—GaN Light-Emitting Diode by Roughening both the p-GaN Surface and the Undoped-GaN Surface", Applied Physics Letters, Jul. 26, 2006, pp. 041116-1-041116-3, vol. 89, American Institute of Physics, US.

Random House Unabridged Dictionary, Second Edition, 1993, p. 2012, Random House, Inc., US.

Random House Webster's College Dictionary, Second Edition, 1997, pp. 85, 427, 462, 515, 748, 857, 914, 1176, 1188, 1285, 1367, and 1368, Random House, Inc., US.

Schubert, E. Fred (2003), Light-Emitting Diodes, First Edition, p. 149, Cambridge University Press, UK.

Schubert, E. Fred (2006). Light Emitting Diodes. Second Edition, 8 select pages, Cambridge University Press, UK.

Schubert, E. Fred (Feb. 2018) Light Emitting Diodes, Third Edition, pp. 3-1-3-20, E. Fred Schubert, US.

Shorter Oxford English Dictionary, Sixth Edition, 2007, pp. 3326, Oxford University Press, US.

Soanes, Catherine, et al. (Editors), "Oxford Dictionary of English", Second Edition, 2003, pp. 100, 101, 568, 613, 685, 998, 1147, 1231, 1605, 1606, 1623, 1762, and 1875, Oxford University Press, UK.

Stringfellow, G.B. and M.G. Crawford (Eds.). (Oct. 1997) High-brightness light-emitting diodes. In: R.K. Willardson and E.R. Weber (Series Eds.), Semiconductors and Semimetals, pp. 176-177, 338-339, vol. 48. New York: Academic Press, US.

Tadatom0, K. et al., "High-output power near-ultraviolet and violet light-emitting diodes fabricated on patterned sapphire substrates using metalorganic vapor phase epitaxy", in Third International Conference on Solid State Lighting, Proceedings of SPIE, Jan. 26, 2004, pp. 243-249, vol. 5187, SPIE, US.

Tadatom0, K., et al., "High Output Power IoGaN Ultraviolet Light-Emitting Diodes Fabricated on Patterned Substrates Using Metalorganic Vapor Phase Epitaxy", physica status solidi (a), Nov. 22, 2001, pp. 121-125, vol. 188, No. 1, Wiley-VCH Verlag GmbH & Co. KGaA, Germany.

Tektite—Marker Lights, Lite Fire Fly products 2003 or earlier U.S., retrieved from the Internet at the Wayback Machine <https://web.archive.org/web/20001015073040/ http://tek-tite.com/Marker_Lights/

(56) References Cited

OTHER PUBLICATIONS marker_lights.html and https://web.archive.org/web/20011024184816/http://tek-tite.com/Marker_Lights/marker_lights.html> on Jan. 8, 2021, 7 pages.
The American Heritage College Dictionary, Fourth Edition, 2002, pp. 91, 459, 494, 550, 790, 909, 974, 1260, 1274, 1275, 1377, and 1461, Houghton Mifflin Company, U.S.
The American Heritage Science Dictionary, First Edition, 2005, excerpt 7 pages, Houghton Mifflin Company, U.S.
The Oxford English Dictionary, Second Edition, vol. XVIII, 1989, pp. 419-420, Oxford University Press, UK.
Tummala, Rao, R., et al., (1989). Microelectronics Packaging Handbook, pp. 548-553 and 1143, Van Nostrand Reinhold, US.
Wikipedia Contributors, "Flexible Circuit", Wikipedia: The Free Encyclopedia, last edited on Mar. 11, 2020, 3 pages, retrieved from https:llen.wikipedia.orglwikil Flexible_circuit on Aug. 7, 2020.
Wikipedia Contributors, "LED Filament", Wikipedia: The Free Encyclopedia, last edited on Jul. 13, 2020, 4 pages, retrieved from https:llen.wikipedia.orglwikil LED_filament on Aug. 7, 2020.
Wu, Chung-Chih, et al,. "Advanced Organic Light-Emitting Devices for Enhancing Display Performances", Journal of Display Technology, Dec. 2005, pp. 248-266, vol. 1, No. 2, IEEE, US.
Yamada, Motokazu, et al., "InGaN-Based Near-Ultraviolet and Blue-Light-Emitting Diodes with High External Quantum Efficiency Using a Patterned Sapphire Substrate and a Mesh Electrode", Jpn. J. Appl. Phys., Dec. 15, 2002, pp. L1431-L1433, Part 2, vol. 12B, The Japan Society of Applied Physics, Japan.
Zhu, Furong, et al., "Toward Novel Flexible Display-Top-Emitting OLEDs on Al-Laminated PET Substrates", Proceedings of the IEEE, Aug. 8, 2005, pp. 1440-1446, vol. 93, No. 8, IEEE, US.
Zukauskas, Arturas, et al., "Chapter 1: A Historical Introduction", Introduction to Solid-State Lighting, Apr. 18, 2002, 14 pages, John Whiley & Sons, Inc., US.
Korean Office Action for Korean Application No. 10-2023-7007442, dated Aug. 5, 2024, 14 pages.
Adachi, S., "Properties of Gallium Arsenide: 18.4 Optical Funcations of AlGaAs: Tables", EMIS Datareview Series No. 2, pp. 513-528, INSPEC (IEEE, New York, 1990).
Atex LED How to contact US. (available at least as early as Feb. 6, 2004 at http://www.atexled.com/contact.html), p. 1, retrieved from the Internet at the Wayback Machine <https://web.archive.org/web/20040206210502/http://www.atexled.com/contact.html> on Jun. 3, 2021.
Atex LED Source Light Gallery, (available at least as early as Feb. 28, 2004 at http://www.atexled.com/gallery_source_02.html), 1 page, retrieved from the Internet at the Wayback Machine <https://web.archive.org/web/20040228040544/http://www.atexled.com/gallery_source_02.html> on Jun. 3, 2021.
Bergh, A.A., et al., (1976), "Light-Emitting Diodes", pp. 472, 510-11, and 562-563, Clarendon Press, UK.
Blackwell, Glenn R. (editor). (2000). The Electronic Packaging Handbook, 1 page, CRC Press, US.
Buffalo Courier (Aug. 29, 1909) General Electric Tungsten Lamps. Buffalo Courier, Aug. 29, 1909, pp. 1, 13, 29, retrieved from the Internet at Newspapers.com by Ancestry.de at <https://www.newspapers.com/image/370380744> on Dec. 16, 2020.
Bulovic, V., et al. "Transparent Light-Emitting Devices", Nature, Mar. 7, 1996, p. 29, vol. 380, Nature Research, UK.
Cambridge Dictionary of American English, 2000, pp. 48, 279, 301, 342, 343, 557, 594, 785, 786, and 928, Cambridge University Press, UK.
Chen, B. J., et al, "Transparent Organic Light-Emitting Devices with LiF/Mg: Ag Cathode", Optics Express, Feb. 7, 2005, pp. 937-941, vol. 13, Optical Society of America, US.
Cheng, Jiping, et al., Development of Translucent Aluminum Nitride (AIN) Using Microwave Sintering Process, Journal of Electroceramics, Oct. 1, 2002, pp. 67-71, vol. 9, No. 1, Kluwer Academic Publishers, Netherlands.
Chua, C.L., et al., "Dielectrically-bonded long wavelength vertical cavity laser on GaAs substrates using strain-compensated multiple quantum wells", IEEE Photonics Technology Letters, Dec. 1994, vol. 6, Issue 12, pp. 1400-1402, IEEE, US.
Cozzan, Clayton, "Monolithic translucent BaMgAl10On: Eu2+ phosphors for laser-driven solid state lighting", AIP Advances, Oct. 11, 2016, pp. 105005-1 to 105005-6, vol. 6, AIP Publishing, US.
Cozzan, Clayton, "Stable, Heat Conducting Phosphor Composites for High-Power Laser Lighting", ACS Applied Materials & Interfaces, Feb. 2018, 34 pages, American Chemical Society, US.
Craford, M. G., "LEDs Challenge the Incandescents", IEEE Circuits and Devices Magazine, Sep. 1992, vol. 8, Issue 5, pp. 24-29, IEEE, US.
Cuong, T. V., et al., "Calculation of the External Quantum Efficiency of Light Emitting Diodes with Different Chip Designs", Phys. Stat. Sol., Sep. 7, 2004, pp. 2433-2437, (c) 1, No. 10, Wiley-VCH Verlag Gmbh & Co. KGaA, Germany.
Drybred, John, "Fulton renovation has modem feel but keeps Victorian look", Intelligencer Journal, Oct. 3, 1995, pp. 1-3, vol. 16, LNP Media Group Inc., US.
Forrest, Stephen, et al. (Feb. 2004). Investigations of Operational Lifetime and Modes of Failure of Organic Light Emitting Devices. United States Air Force Research Laboratory, AFRL-HE-WP-TR-2003-0154, 87 pages, U.S. Government Publishing Office, US.
Fralic, Shelley, "Rejuvenation", The Vancouver Sun, Aug. 18, 2006, pp. 1-5, Postmedia Network Inc., Canada.
Freudenrich, Craig, "How OLEDs Work", Mar. 24, 2005, retrieved from the Internet at <https://electronics.howstuffworks.comloled.htm> on Jul. 14, 2005, 7 pages.
Fujii, T., et al., "Increase in the extraction efficiency of GaN-based light-emitting diodes via surface roughening", Appl. Phys. Lett., Feb. 9, 2004, pp. 855-857, vol. 84, No. 6, American Institute of Physics, US.
Gordon, Roy G., et al., "Chemical vapor deposition of aluminum nitride thin films", Journal of Materials Research, Jul. 1992, pp. 1679-1684, vol. 7, No. 7, Materials Research Society, US.
Gove, Babcock Philip (Editor), "Webster's Third New International Dictionary of the English Language Unabridged", 2002, excerpt of 17 pages, Merriam-Webster Inc., US.
Graf, Rudolf F. (1999) Modem Dictionary of Electronics 7th Edition, pp. 270, 417-420, 422, 486, 677-678, 686, 745, 799, Newnes, Australia.
Greig, William. (2007). Integrated Circuit Packaging, Assembly and Interconnections, pp. 276-277, Springer, Germany.
Gu, G., et al., "Transparent Organic Light Emitting Devices", Applied Physics Letters, May 6, 1996, vol. 68, No. 19, pp. 2606-2608, American Institute of Physics, US.
Gu, G., et al., "Transparent Stacked Organic Light Emitting Devices. II. Device Performance and Applications to Displays", Journal of Applied Physics, Oct. 15, 1999, pp. 4076-4084, vol. 86, No. 8, American Institute of Physics, US.
Han, Dae-Seob, et al., "Improvement of Light Extraction Efficiency of Flip- Chip Light-Emitting Diode by Texturing the Bottom Side Surface of Sapphire Substrate", IEEE Photonics Technology Letters, Jul. 1, 2006, pp. 1406-1408, vol. 18, No. 13, IEEE, US.
Hoefler G. E., et al., "Wafer bonding of 50-mm diameter GaP to AlGaInP—GaP light-emitting diode wafers", Appl. Phys. Lett. Aug. 5, 1996, pp. 803-805, vol. 69, American Institute of Physics, US.
Interrante, Leonard V., et al., "Studies of organometallic precursors to aluminum nitride", Mat. Res. Soc. Symp. Proc., Apr. 15-19, 1986, vol. 73., pp. 359-366, Materials Research Society, U.S.
IPEA/409—International Preliminary Report on Patentability Mailed on Feb. 16, 2023 for WO Application No. PCT/US21/043701, 8 page(s).
Jasinski, J., et al., "Microstructure of GaAs/GaN interfaces produced by direct wafer fusion", Applied Physics Letters, Oct. 21, 2002, pp. 3152-3154, vol. 81, No. 17, American Institute of Physics, US.
Jewell, Elizabeth, et al. (Editors), "The New Oxford American Dictionary", 2001, pp. 102,557,671,971, 1115, 1198, 1550, 1549, 1567, 1696, 1799, and 1800, Oxford University Press, US.
Johnson, Colin R. (Jan. 12, 2003) Sandia: Output/wavelength firsts for deep-UV LEDs, EE/Times, retrieved from the Internet at <https://www.eetimes.com/sandia-output-wavelength-firsts-for-deep-uv-leds/#> on Sep. 9, 2019, 3 pages.

(56) References Cited

OTHER PUBLICATIONS

Kish, F. A., et al., "Low-resistance Ohmic conduction across compound semiconductor wafer-bonded interfaces" Appl. Phys. Lett., Oct. 2, 1995, pp. 2060-2062, vol. 67, American Institute of Physics, US.

Kish, F. A., et al., "Very high-efficiency semiconductor wafer-bonded transparent substrate (AlxGa1-x)osinosP/GaP light-emitting diodes", Appl. Phys. Lett., May 12, 1994, pp. 2839-2841, vol. 64, American Institute of Physics, U.S.

Klages, Klages, "A Trick of the light: Designers share easy lighting tips to transform a room, and a mood", Calgary Herald, Jan. 6, 2001, pp. 1-5, Postmedia Network Inc. Canada.

Kuo, H.C., et al., (Oct. 29-Nov. 3, 2006), "Improvement in the Extraction Efficiency of AlGaInP and GaN Thin Film LEDs Via N-Side Surface Roughing", 210th ECS Meeting, Abstract #1548, 2 pages, vol. 3, The Electrochemical Society, US.

Kuramoto, Nobuyuki, et al., "Translucent AlN ceramic substrate", IEEE Transactions on Components, Hybrids, and Manufacturing Technology, Dec. 1986, pp. 386-390, vol. CHMT- 9, No. 4, IEEE, US.

Laplante, Phillip A. (1999) Comprehensive Dictionary of Electrical Engineering, 1999, 32 pages excerpt, including Prefaces, Forward, Editors, 6, 18, 62, 86, 213, 362, 364, and 584, CRC Press LLC, US.

Laplante, Phillip A. (2000) Electrical Engineering Dictionary CRCnetBASE, 2000, excerpt 3 pages, CRC Press LLC, US.

Lee, Chan, J., et al., "Cavity effect of transparent organic emitting device using metal cathode", Proceedings of SPIE, Sep. 8, 2004, pp. 306-313, vol. 5464, Strasbourg, France.

Lee, Song J., "Analysis ofInGaN High-Brightness Light-Emitting Diodes", Japanese Journal of Applied Physics, Nov. 1998, pp. 5990-5993, vol. 37, Issue 11, The Japan Society of Applied Physics, Japan.

Lee, Stuart M. (Editor), "Dictionary of Composite Materials Technology", 1989, pp. 62, 29, 138, and 147, Technomic Publishing Company, US.

Liau, Z.L. et al., "Wafer fusion: A novel technique for optoelectronic device fabrication and monolithic integration", Appl. Phys. Lett., Feb. 19, 1990, pp. 737-739, vol. 56, No. 8, American Institute of Physics, US.

Merriam-Webster's Collegiate Dictionary, Tenth Edition, 2000, pp. 74, 377, 412, 462, 662, 758, 759, 811, 1060, 1073, 1171, 1250, and 1251, Merriam-Webster, Incorporated, US.

Millodot, Michel, "Dictionary of Optometry and Visual Science", Seventh Edition, Aug. 25, 2009, pp. 37,191,192,204,206,231,332,351, and 389, Elsevier Limited, UK.

Murai, Akihiko, et al., "Hexagonal pyramid shaped light-emitting diodes based on ZnO and GaN direct wafer bonding" Applied Physics Letters, Oct. 26, 2006, pp. 171116-1-171116-3, vol. 89, No. 17, American Institute of Physics, US.

Murai, Akihiko, et al., "Wafer Bonding of GaN and ZnSSe for Optoelectronic Applications", Jpn. J. Appl. Phys., Sep. 10, 2004, pp. L1275-L1277, vol. 43, No. 10A, The Japan Society of Applied Physics, Japan.

Nakahara, K. et al., "Improved External Efficiency InGaN-Based Light- Emitting Diodes with Transparent Conductive Ga-Doped ZnO asp-Electrodes", Jpn. J. Appl. Phys., Jan. 9, 2004, pp. L180-L182, vol. 43, No. 2A, The Japan Society of Applied Physics, Japan.

Nakamura, Shuji, et al., "High-Brightness InGaN Blue, Green and Yellow Light-Emitting Diodes with Quantum Well Structures", Jpn. J. Appl. Phys., Jul. 1, 1995, pp. L797-L799, vol. 34, Part 2, No. 7A, The Japan Society of Applied Physics, Japan.

\* cited by examiner

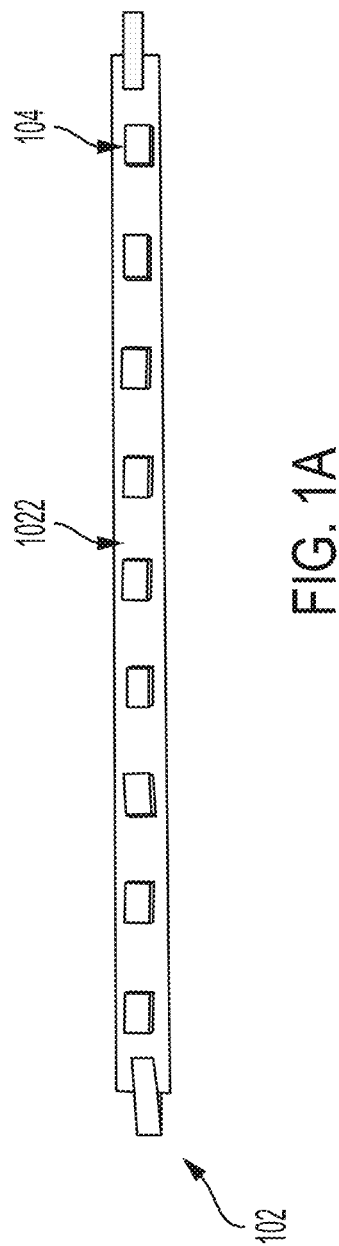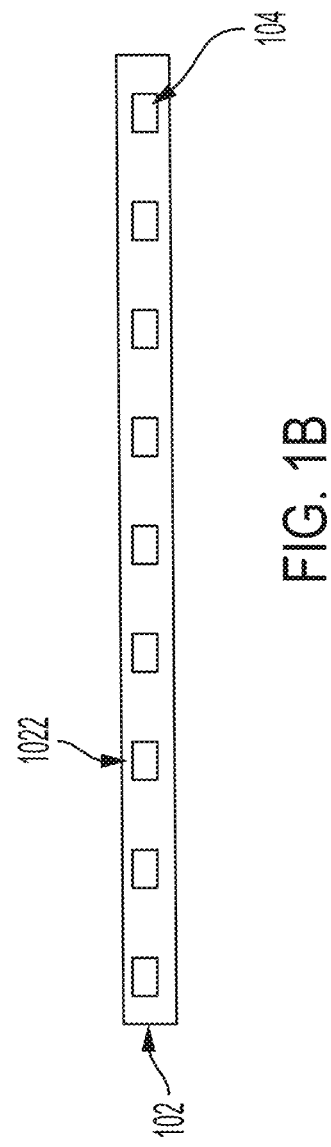

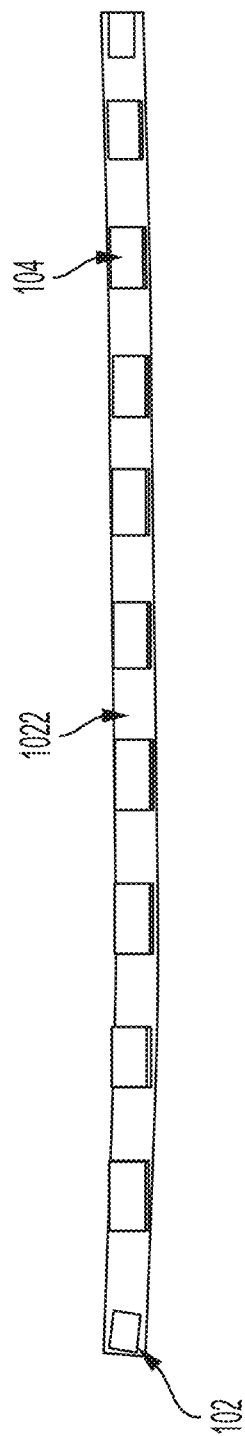

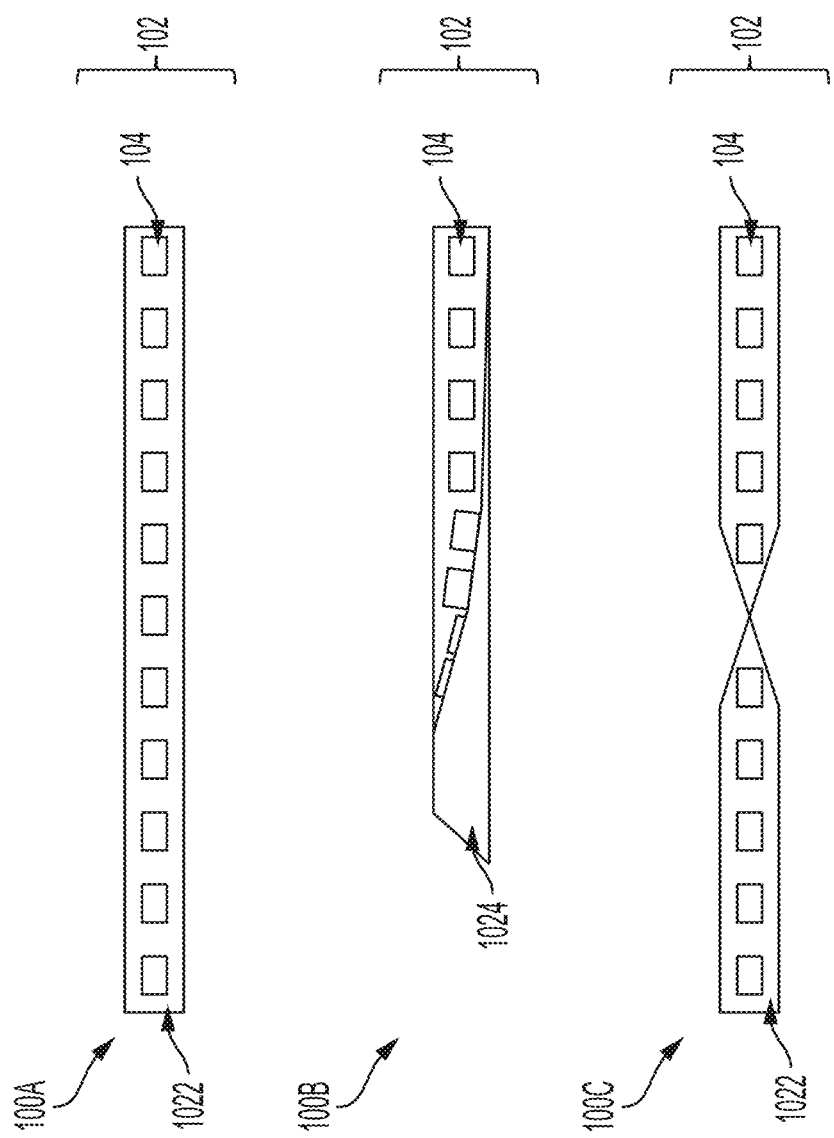

OMNIDIRECTIONAL FLEXIBLE LIGHT EMITTING DEVICE

CROSS-REFERENCE TO RELATED APPLICATIONS

The present application is a continuation of and claims priority to and the benefit of U.S. Nonprovisional patent application Ser. No. 16/983,747, filed Aug. 3, 2020, the contents of which as are hereby incorporated by reference herein in their entirety.

BACKGROUND

Light emitting devices may comprise light emitting diodes. Light emitting diodes (also referred to herein as LEDs) are semiconductor devices that emit light when an electric current is passed through them. The light is produced when particles that carry the electric current (e.g., electrons and holes) combine together with the semiconductor material of the semiconductor devices. LEDs are described as solid-state devices, which distinguishes them from other lighting technologies that use heated filaments or gas discharge as lighting sources (e.g., incandescent, tungsten halogen lamps; fluorescent lamps).

LEDs are widely used in lighting applications for residential and commercial structures. Light bulbs utilizing LEDs are far more efficient when compared to traditional lighting such as incandescent and fluorescent lights. Most of the energy in LEDs is converted into light and a minimal amount results in heat.

Conventional filament-type lighting devices utilizing LEDs typically have LEDs mounted on one side of the filament. This single-sided configuration of conventional LED filaments provides poor light distribution. To overcome this problem of poor light distribution, conventional solutions have either increased the number of LED filaments mounted in lighting fixtures, and/or employed transparent or translucent filament substrates.

Through applied effort, ingenuity, and innovation many deficiencies of such systems have been solved by developing solutions that are in accordance with the embodiments of the present invention, many examples of which are described in detail herein.

SUMMARY

Various embodiments are directed to a light emitting device configured for providing omnidirectional light output. In certain embodiments, the light emitting device comprises a flexible substrate having a substrate length, a first substrate surface and a second substrate surface. In embodiments, the flexible substrate is configured to be twisted and/or rotated around a longitudinal axis. In embodiments, the light emitting device further comprises a plurality of LED packages disposed on the first substrate surface. The plurality of LED packages of certain embodiments are configured to emit light outward from the flexible substrate.

In embodiments, the flexible substrate may be configured to be permanently flexible. In certain embodiments, the flexible substrate is configured to be twisted and/or rotated within a range of 0° to 90°, 90° to 180°, or 180° to 360°. The flexible substrate of certain embodiments is configured to radiate heat.

In embodiments, the flexible substrate of the light emitting device may further comprise a circuit board. In embodiments, the circuit board comprises a first and second side. In embodiments, the flexible substrate of the light emitting device further comprises a plurality of LED packages disposed on and/or electrically and mechanically couplable to the first side. In embodiments, the flexible substrate of the light emitting device further comprises a plurality of leads/traces disposed on and/or electrically and mechanically couplable to the first or second side of the circuit board and electrically couplable with the plurality of LED packages. In embodiments, the flexible substrate further comprises driver circuitry disposed on and/or electrically and mechanically couplable to the first side or second side of the circuit board. The driver circuitry of certain embodiments is electrically couplable with the plurality of leads/traces of the circuit board.

In certain embodiments, the plurality of LED packages comprise phosphor-based LED packages. Moreover, the flexible substrate of certain embodiments is of a matching color as a phosphor color of the phosphor-based LED packages. In certain embodiments, the plurality of LED packages are configured to emit blue light.

In certain embodiments, the substrate width and at least one LED package width are the same width. In certain embodiments, the flexible substrate comprises polyamide. The substrate width of certain embodiments is 1 to 2 mm, and the substrate length is 5 cm.

Various embodiments directed to a lighting apparatus configured for providing omnidirectional light output are provided. In embodiments, a lighting apparatus may comprise a transparent housing. The transparent housing of certain embodiments may be configurable to house a light emitting device. The transparent housing of certain embodiments may be configurable to protect the integrity of the light emitting device housed within. For example, in various embodiments, the transparent housing may be infused with a gas that is conducive for inhibiting the introduction of moisture and/or other contaminants into the transparent housing. For example, the transparent housing may be infused with dry air or an inert gas to this end.

In embodiments, a lighting apparatus may comprise a base for electrically coupling with a lighting socket. In embodiments, a lighting apparatus may comprise a light emitting device. The light emitting device of certain embodiments is electrically couplable with the base and housed within the transparent housing. The light emitting device of certain embodiments comprises a flexible substrate having a substrate length, a substrate width, a first substrate surface and a second substrate surface. In embodiments, the flexible substrate is configured to be twisted and/or rotated around a longitudinal axis that is parallel to the substrate length. In embodiments, a plurality of LED packages are disposed on the first substrate surface. The LED packages of certain embodiments each comprise an LED package width and are configured to emit light outward from the flexible substrate.

In embodiments, the plurality of LED packages comprise phosphor-based LED packages.

In embodiments, the flexible substrate is of a matching color as a phosphor color of the phosphor-based LED packages.

The substrate width and each LED package width of certain embodiments are the same width.

In embodiments, the base comprises an Edison-type base.
In embodiments, the base comprises a G4-type base.
In embodiments, the base comprises a G6.35-type base.
In embodiments, the base comprises a G6.35-type base.
In embodiments, the base comprises a G9-type base.

The base of certain embodiments is mechanically and/or electrically couplable to the circuit board of the light emitting device of certain embodiments, such that electrical current is provided to the light emitting device.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

BRIEF DESCRIPTION OF THE DRAWINGS

The following Detailed Description, Figures, and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 1A, 1B, and 1C are top views of an exemplary flexible substrate configured in accordance with embodiments of the present disclosure;

FIG. 2A is a top view illustration of the range of rotation of an exemplary flexible substrate configured in accordance with embodiments of the present disclosure;

DETAILED DESCRIPTION

Figure 2B:
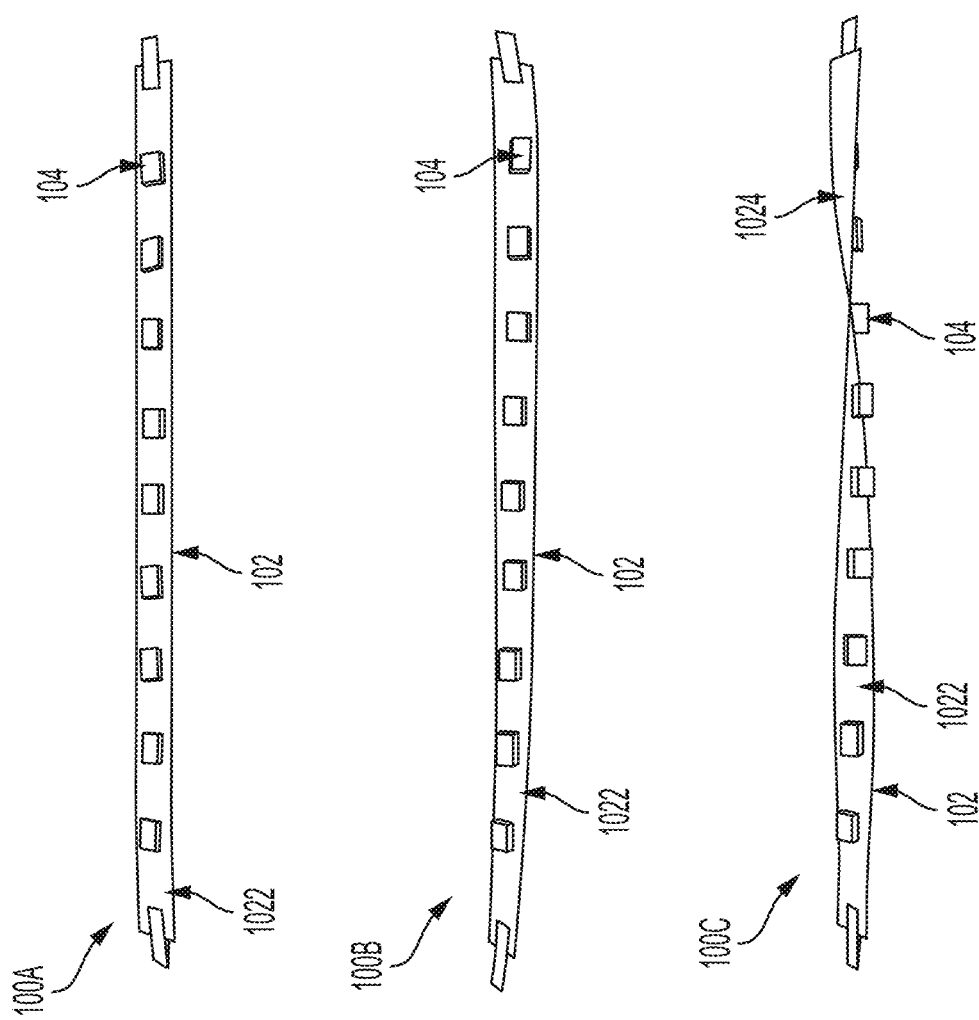
FIG. 2B-2C are perspective views of the range of rotation of an exemplary flexible substrate configured in accordance with embodiments of the present disclosure.

The present disclosure more fully describes various embodiments with reference to the accompanying drawings. It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

Lighting emitting devices according to the present disclosure provide greater functionality over conventional lighting devices. Conventional lighting devices employing flexible substrates are typically configured with a first flexible substrate mounted to a second substrate. The second substrate is typically complex in shape. Such a heterogeneous arrangement of substrates contributes to deformation, fracture, delamination, etc., because of the different compositions of the first and second substrates.

Light emitting devices according to the present disclosure may employ a single, twistable substrate. Light emitting devices according to the present disclosure therefore obviate the need for a second substrate, lowering manufacturing costs and providing greater functionality.

Furthermore, a twistable substrate according to the present disclosure may be configured into various shapes as needed. Such adaptability provides greater functionality and light dispersion over conventional designs. For example, a twistable substrate according to the present disclosure may be configured to substantially define a helical shape. The twistable substrate of various embodiments may then, for example, be configured to comprise a plurality of LEDs and suspend between supporting wires, thereby overcoming the deficiencies of conventional LED filament devices.

Conventional devices are typically manufactured so that a flexible substrate accentuates the shape of a standard (e.g., Edison-style) light bulb. Such a conventional design is deficient because it results in a nonoptimal disposition of the LEDs within the light bulb. On the other hand, flexible substrates according to the present disclosure are inherently more geometrically efficient.

The substantially helical configuration of the above example may dispose the LEDs within the light bulb more efficiently. This is because the geometry of a helix ensures that some portion of the light emitted from each LED will maintain a constant angle with the flexible substrate itself. More light from the plurality of LEDs may therefore be emitted outward from the lighting emitting device; less light may be wasted. A flexible substrate according to the present disclosure may be configured in various other regular and irregular shapes. For example, a flexible substrate according to the present disclosure may comprise a spiral or coil shape, while retaining flexibility and geometric efficiency.

Light emitting devices of embodiments according to the present disclosure overcome further light distribution deficiencies of conventional light emitting devices. Conventional lighting devices employing LED filaments are typically configured with LEDs on a single side of the filament. LEDs are "directional" light sources (e.g., LEDs are inherently configured to emit light in a specific and singular direction). Conventional lighting devices therefore produce poor omnidirectional light emission as a result of this single-sided configuration. Employing a twistable/rotatable substrate having LEDs disposed thereon overcomes this directionality deficiency, because the flexible substrate itself is conducive for dictating the direction of light emission. Light emitting devices according to the present disclosure may therefore achieve better, more omnidirectional light emission over conventional lighting devices.

Moreover, conventional lighting devices necessarily employ transparent or translucent filament substrates to compensate for their single-sided configuration. By employing twistable substrates, light emitting devices according to the present disclosure may be configured having opaque or otherwise less than transparent/translucent substrates. Light emitting devices according to embodiments of the present disclosure may therefore provide users with a greater degree of aesthetic choice.

Given the above, it may therefore be desirable to configure a light emitting device according to embodiments of the present disclosure such that two or more flexible substrates are employed. Light emitting devices according to the present disclosure may employ multiple flexible substrates and still achieve improved omnidirectional light emission over conventional lighting devices.

FIGS. 1A, 1B, and 1C are top views of an exemplary flexible substrate 102 configured in accordance with embodiments of the present disclosure. In embodiments, a flexible substrate 102 may comprise a substrate length, a substrate width, a first substrate surface 1022, and a second substrate surface (not shown). In embodiments, the flexible substrate 102 may be configured to be twistably and/or rotatably wrenched about a longitudinal axis that is parallel to the substrate length. The flexible substrate 102 of certain embodiments comprises material conducive for the twisting/rotating of the flexible substrate 102, including but not limited to plastic, polyamide. In embodiments, a plurality of LED packages 104 may be disposed on the first surface 1022 of the flexible substrate 102. The LED packages 104 of certain embodiments may have an LED package width and be configured to emit light outward from the flexible substrate 102. The plurality of LED packages 104 may be electrically connected in series with one another. FIG. 1A illustrates a first LED package width configuration, wherein the LED package width is less than the substrate width. As shown in FIG. 1B, the LED package width of certain embodiments may be equal to or very nearly equal to the substrate width, so that the flexible substrate 102 blocks as little light as possible.

In embodiments, the flexible substrate 102 may be configured to radiate heat. That is, the flexible substrate 102 of certain embodiments may comprise material(s) suitably tolerant of the heat generated by the plurality of LED packages 104. In embodiments, the plurality of LED packages 104 may comprise phosphor-based LED packages. The phosphor-based LED packages 104 of certain embodiments may be configured to emit blue light. Moreover, in embodiments the flexible substrate 102 may be of a matching color as a phosphor color of the phosphor-based LED packages 104 so as to camouflage the flexible substrate 102. The flexible substrate 102 may be configured as opaque or may be less than transparent. The flexible substrate 102 may be configured with metal contact ends for soldering to support wires. The metal contact ends of the flexible substrate 102 may comprise electrical contact pads for mechanical and electrical connection. In embodiments, the flexible substrate 102 may comprise polyamide. In embodiments, the substrate width and each LED package width may be the same width such that the flexible substrate 102 blocks as little light as possible. In embodiments, the substrate width of the flexible substrate 102 may be 1 to 2 millimeters, and the substrate length of the flexible substrate 102 may be 5 centimeters.

Figure 2C:
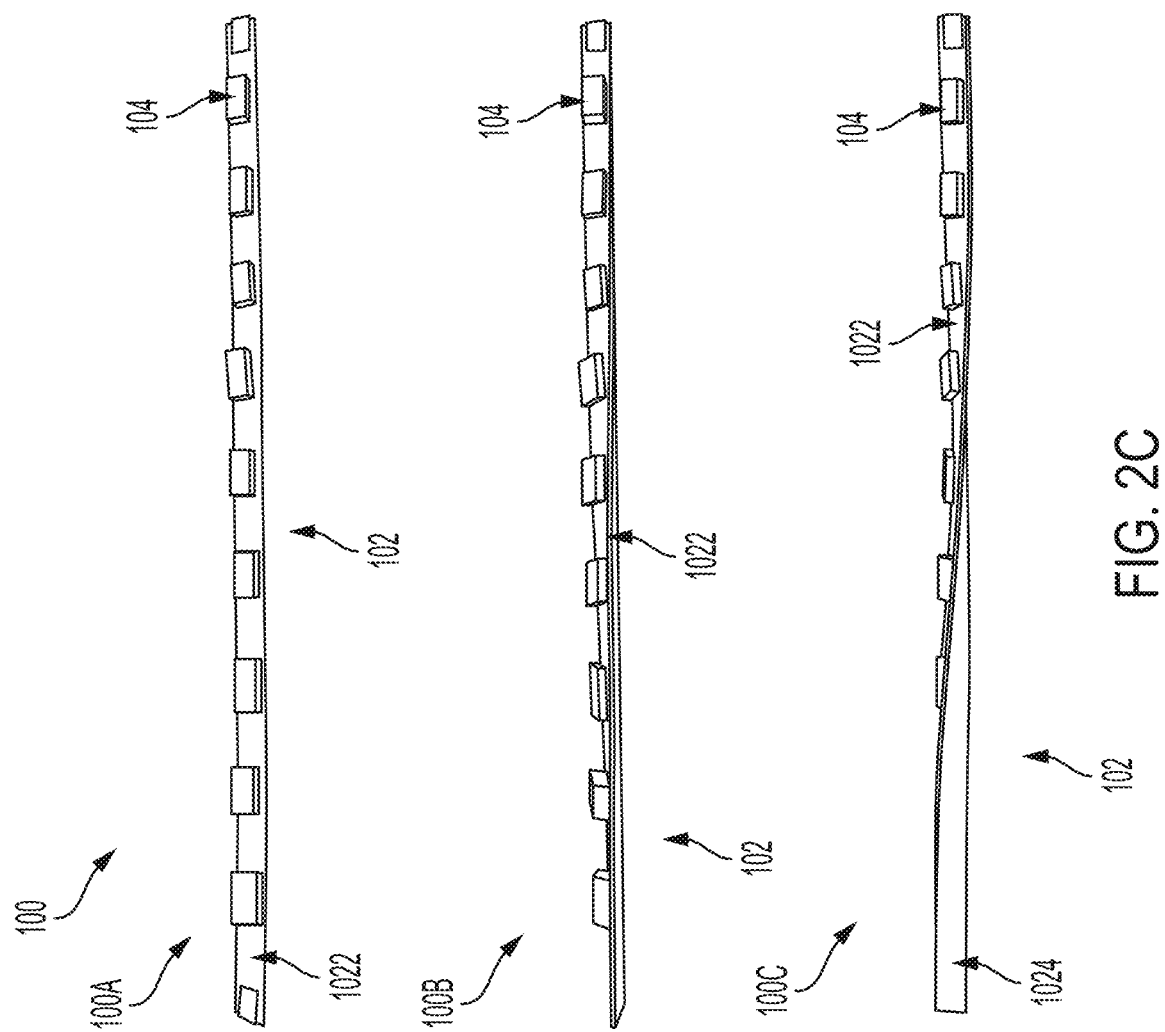

FIG. 2A is a top view illustration of the range of rotation of an exemplary flexible substrate 102 configured in accordance with embodiments of the present disclosure. FIGS. 2B-2C are perspective views of the range of rotation of an exemplary flexible substrate 102 configured in accordance with embodiments of the present disclosure. In embodiments, the flexible substrate 102 may be configured to be permanently flexible. That is, the flexible substrate 102 may retain the shape into which the flexible substrate 102 is twisted and/or rotated upon release of the torque causing the flexible substrate 102 to be twisted and/or rotated about a longitudinal axis parallel to the substrate length of the flexible substrate 102. The flexible substrate 102 may be configured to be twisted and/or rotated at least 360°. An exemplary flexible substrate 102 may be configured to be twisted and/or rotated within a range of 90° to 180°. In embodiments, exemplary flexible substrate 102 may be configured to be twisted and/or rotated within a range of 180° to 360°. In embodiments, exemplary flexible substrate 102 may be configured to be twisted and/or rotated within a range of 0° to 90°.

A relaxed or untwisted flexible substrate 102 is shown by 100A. The LED packages 104 are disposed facing in a uniform direction when the flexible substrate 102 is relaxed. A flexible substrate 102 twisted approximately 90° is shown by 100B. As shown, a first subset of LED packages 104 are disposed facing in a direction nearly perpendicular to a second subset of LED packages 104. A flexible substrate 102 twisted approximately 180° is shown by 100C. An example visual hallmark of a 180° rotation is that the second substrate surface 1024 now becomes visible. Further, a first subset of LED packages 104 are now disposed facing antiparallel (e.g., in the opposite direction) to a second subset of LED packages 104.

Figure 3:
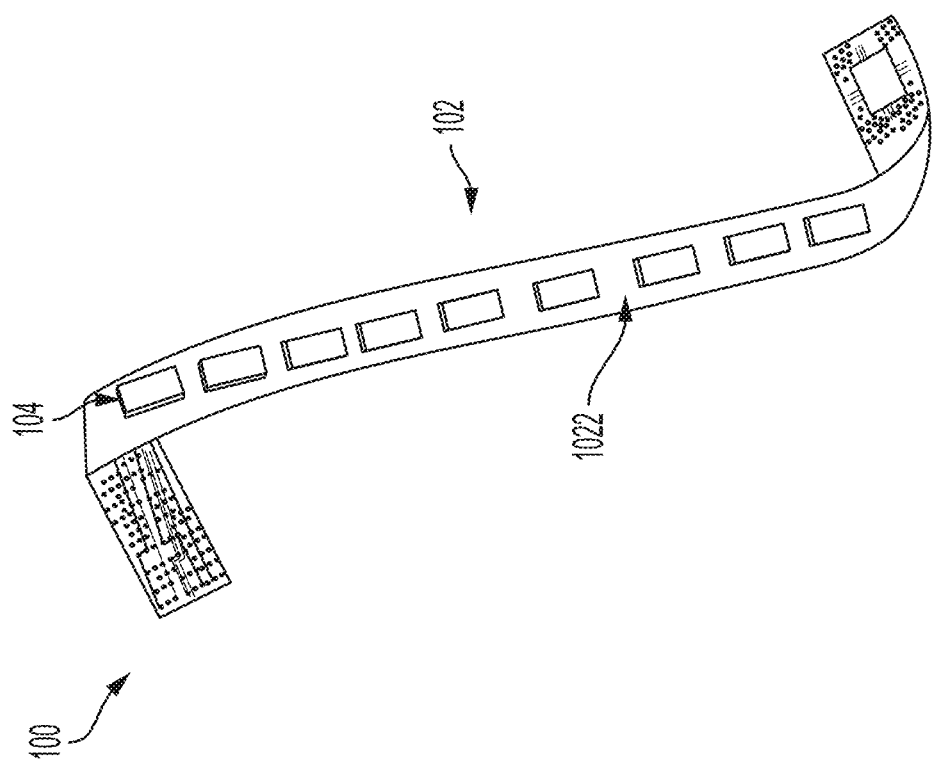
FIG. 3 is a perspective view of an exemplary flexible substrate configured in accordance with embodiments of the present disclosure.

FIG. 3 is a perspective view of an exemplary flexible substrate 102 configured in accordance with embodiments of the present disclosure. In embodiments, the exemplary flexible substrate 102 may further comprise a circuit board having a first side 1022 and a second side 1024. A plurality of LED packages 104 may be disposed on and/or electrically and mechanically couplable to the first side 1022. A plurality of leads/traces 302 may be disposed on and/or electrically and mechanically couplable to the first side 1022 or second side 1024 and with the plurality of LED packages 104. For example, the LED packages 104 may couplable to the first side 1022 by e.g., wire bonding or soldering. Driver circuitry 304 may be any driver circuitry suitable for converting blue-phosphor LEDs to white light with minimal energy lost as heat.

Figure 4:
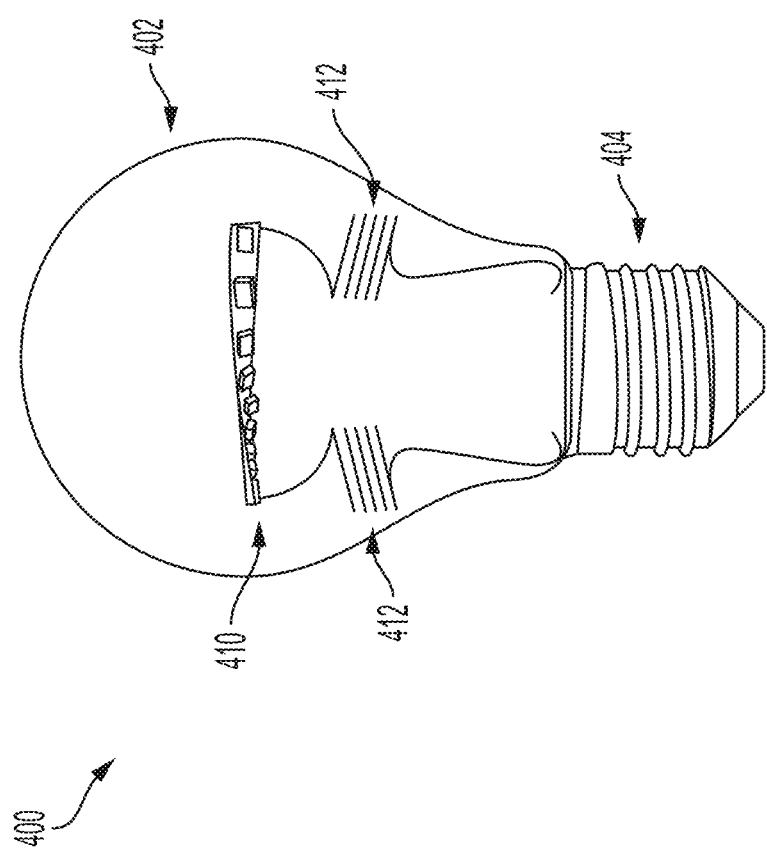
FIG. 4 illustrates an exemplary lighting apparatus in accordance with embodiments of the present disclosure.

FIG. 4 illustrates an exemplary lighting apparatus 400 configured in accordance with embodiments of the present disclosure. In embodiments, the lighting apparatus 400 comprises a transparent housing 402. The transparent housing 402 of certain embodiments may be configured to house a lighting emitting device 410. In embodiments, the lighting apparatus 400 comprises a base 404 for electrically coupling with a lighting socket. The lighting emitting device 410 of certain embodiments is electrically couplable with the base 404 and is housed within the transparent housing 402. The light emitting device 410 may be mounted within the transparent housing 402 with supporting wires 412. In embodiments, the lighting emitting device 410 comprises a flexible substrate 102. The flexible substrate 102 may be configured with metal contact ends. The metal contact ends 413 of the flexible substrate 102 may comprise electrical contact pads 414 for mechanical and electrical connection of the light emitting device 410 with the base 404 (see, e.g., FIGS. 5A-5B). For example, the supporting wires 412 may be electrically and mechanically couplable to the electrical contact pads 414 of the flexible substrate 102. The supporting wires 412 may thus couple the flexible substrate 102 of the light emitting device 410 with the base 404, via the electrical contact pads 414. Alternatively, the flexible substrate 102 may be coupled to a supporting structure independent of metal contact ends. The base 404 of certain embodiments may be configured as a variety of light bulb base types (e.g., Edison (e.g., E10, E11, E26), G4, G6.35, GY6.35, and the like). In embodiments, the base 404 is mechanically and/or electrically couplable to the circuit board 102 of the light emitting device 410 of certain embodiments, such that electrical current is provided to the light emitting device 410.

The flexibility of the flexible substrate 102 may be either temporary or permanent. When the flexibility is temporary, the flexible substrate 102 is electrically and mechanically coupled to the supporting wires 412 prior to having a suitable torque applied so as to configure it in a twisted orientation. Alternatively, a permanently flexible substrate 102 may be configured in a twisted orientation prior to being electrically and mechanically coupled to the supporting wires 412. For example, a mixture of phosphor and silicone/epoxy may first be applied to the flexible substrate 102. The flexible substrate 102 may then be configured to the desired rotation and, while maintaining the desired configuration, secured to the supporting wires 412. The flexible substrate 102 may therefore permanently maintain its configuration. Alternatively, the flexible substrate 102 may comprise material naturally conducive to maintaining permanent flexibility (e.g., copper).

Figure 5A:
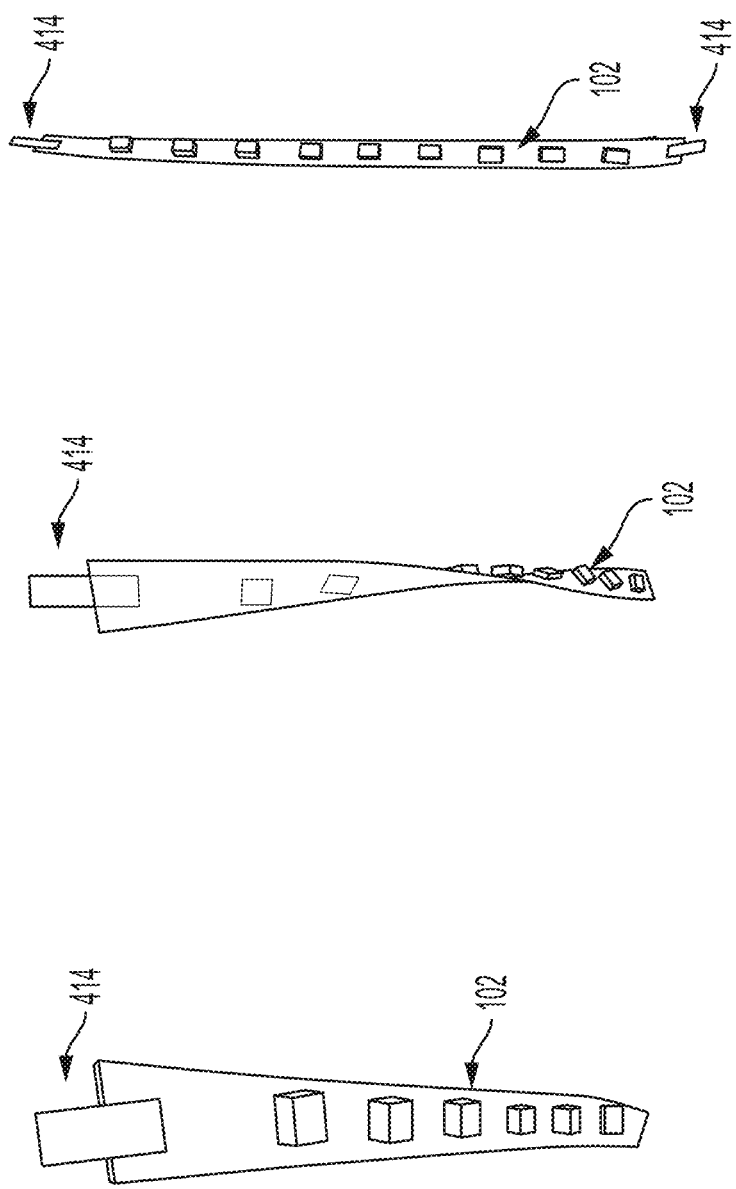
FIGS. 5A-5B are perspective views illustrating a flexible substrate according to various embodiments of the present disclosure.
Figure 5B:
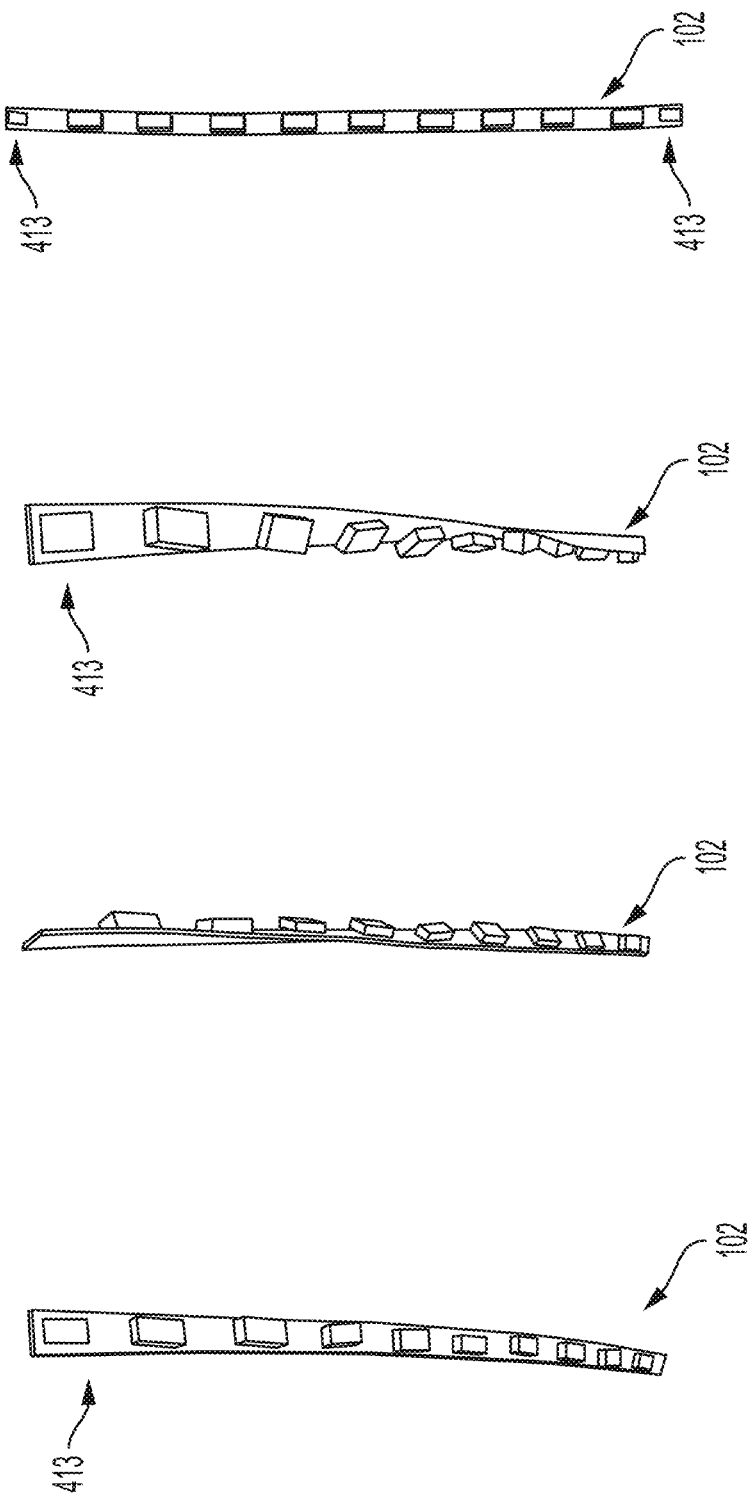

FIGS. 5A-5B are perspective views illustrating a flexible substrate 102 according to various embodiments. FIG. 5A illustrates a flexible substrate 102 configured with electrical contact pads 414. FIG. 5B illustrates a flexible substrate 102 configured with metal contact ends 413 that may or may not comprise electrical contact pads 414. In embodiments, the metal contact ends 413 may be suitable for soldering to the supporting wires 412.

Many modifications and other embodiments will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A light emitting device, comprising:
   a flexible substrate having a first substrate surface; and
   a plurality of LED packages disposed on the first substrate surface, wherein the plurality of LED packages comprises phosphor-based LED packages and the flexible substrate is of a matching color as a phosphor color of the phosphor-based LED packages.

2. The light emitting device of claim 1, wherein one or more LED packages of the plurality of LED packages is configured to emit light outward from the flexible substrate.

3. The light emitting device of claim 1, wherein the flexible substrate has a substrate length.

4. The light emitting device of claim 3, wherein the flexible substrate is configured to be flexibly wrenched about a longitudinal axis that is parallel to the substrate length.

5. The light emitting device of claim 4, wherein the flexible substrate is configured to be twistably or rotatably wrenched about the longitudinal axis.

6. The light emitting device of claim 1, wherein the flexible substrate is configured to be twisted and/or rotated within a range of one or more of 0° to 90°, 90° to 180°, or 180° to 360°.

7. The light emitting device of claim 1, wherein the flexible substrate is configured to radiate heat.

8. The light emitting device of claim 1, wherein the flexible substrate further comprises:
   a circuit board comprising a first side and a second side;
   the plurality of LED packages disposed on and/or electrically and mechanically couplable to the first side;
   a plurality of leads/traces disposed on and/or electrically and mechanically couplable to one or more of the first side or second side and electrically couplable with the plurality of LED packages; and
   driver circuitry disposed on and/or electrically and mechanically couplable with one or more of the first side or second side.

9. The light emitting device of claim 8, wherein, the driver circuitry is electrically couplable with the plurality of leads/traces of the circuit board.

10. The light emitting device of claim 1, wherein one or more of the plurality of LED packages are configured to emit blue light.

11. The light emitting device of claim 1, wherein one or more LED packages of the plurality of LED packages comprises an LED package width.

12. The light emitting device of claim 11, wherein a substrate width of the flexible substrate is one or more of equivalent to or greater than at least one LED package width.

13. The light emitting device of claim 1, wherein the flexible substrate comprises polyamide.

14. The light emitting device of claim 13, wherein the flexible substrate has a substrate width of 1 to 2 mm and a substrate length of 5 cm.

15. A lighting apparatus, comprising:
   a transparent housing;
   a base for electrically coupling with a lighting socket; and
   a light emitting device electrically couplable with the base and housed within the transparent housing, wherein the light emitting device comprises:
   a flexible substrate having a substrate length and a first substrate surface; and
   a plurality of LED packages disposed on the first substrate surface, wherein the plurality of LED packages comprises phosphor-based LED packages and the flexible substrate is of a matching color as a phosphor color of the phosphor-based LED packages.

16. The lighting apparatus of claim 15, wherein the flexible substrate configured to be flexibly wrenched about a longitudinal axis that is parallel to a substrate length of the flexible substrate.

17. The lighting apparatus of claim 15, wherein each LED package of the plurality of LED packages is configured to emit light outward from the flexible substrate.

18. The lighting apparatus of claim 15, wherein the base comprises one or more of an Edison-type base, a G4-type base, a G6.35-type base, a G6.35-type base, a G9-type base.

19. The lighting apparatus of claim 15, wherein the flexible substrate further comprises:
   a circuit board, the circuit board having a first side and a second side;
   a plurality of LED packages disposed on and/or electrically and mechanically couplable to the first side;
   a plurality of leads/traces disposed on and/or electrically and mechanically couplable to one or more of the first side or second side and electrically couplable with the plurality of LED packages; and
   driver circuitry disposed on and/or electrically and mechanically couplable with one or more of the first side or second side, the driver circuitry electrically couplable with the plurality of leads/traces of the circuit board.

20. The lighting apparatus of claim 19, wherein the base is mechanically and/or electrically couplable to the circuit board of the light emitting device such that electrical current is provided to the light emitting device.

* * * * *